(12) United States Patent
Gaide et al.

(10) Patent No.: US 8,937,491 B2
(45) Date of Patent: Jan. 20, 2015

(54) CLOCK NETWORK ARCHITECTURE

(71) Applicant: Xilinx, Inc., San Jose, CA (US)

(72) Inventors: Brian C. Gaide, Longmont, CO (US);
Steven P. Young, Boulder, CO (US);
Trevor J. Bauer, Boulder, CO (US);
Robert M. Ondris, Santa Clara, CA (US); Dinesh D. Gaitonde, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 118 days.

(21) Appl. No.: 13/677,971

(22) Filed: Nov. 15, 2012

(65) Prior Publication Data
US 2014/0132305 A1 May 15, 2014

(51) Int. Cl.
*H03K 19/177* (2006.01)
*H03K 5/12* (2006.01)
*G06F 1/04* (2006.01)
*H03K 19/096* (2006.01)
*G06F 1/10* (2006.01)
*G06F 17/50* (2006.01)

(52) U.S. Cl.
CPC ............... *H03K 19/096* (2013.01); *G06F 1/10* (2013.01); *H03K 19/1774* (2013.01); *G06F 17/5054* (2013.01)
USPC ............... 326/93; 326/41; 326/101; 327/365; 713/500

(58) Field of Classification Search
CPC .................. H03K 19/17736; H03K 19/1774; H03K 19/17792; H03K 19/17744; H03K 19/17796; H04J 3/0638; H04J 3/0682; G06F 1/10; G06F 2217/62; G06F 17/5054; G11C 11/4093; G11C 7/222
USPC ........ 326/41, 47, 101, 93; 327/141, 144, 145, 327/295, 296, 365; 716/101
See application file for complete search history.

(56) References Cited

U.S. PATENT DOCUMENTS

| | | | |
|---|---|---|---|
| 6,075,832 A * | 6/2000 | Geannopoulos et al. | 375/375 |
| 6,292,020 B1 | 9/2001 | Crabill | |
| 6,630,855 B2 * | 10/2003 | Fayneh et al. | 327/295 |
| 6,952,813 B1 | 10/2005 | Rahut | |
| 7,353,487 B1 | 4/2008 | Bergendahl et al. | |
| 7,362,135 B1 * | 4/2008 | Chang | 326/47 |
| 7,430,728 B1 | 9/2008 | Rahut | |
| 7,576,563 B1 * | 8/2009 | Wei et al. | 326/41 |
| 7,586,355 B2 * | 9/2009 | Parris et al. | 327/296 |
| 7,737,751 B1 | 6/2010 | Lai et al. | |
| 7,791,370 B1 * | 9/2010 | Hoang et al. | 326/38 |
| 7,904,860 B1 | 3/2011 | Rahut | |
| 8,271,912 B2 * | 9/2012 | Ellavsky et al. | 716/101 |
| 2007/0188188 A1 | 8/2007 | Or-Bach et al. | |

* cited by examiner

*Primary Examiner* — Vibol Tan
(74) *Attorney, Agent, or Firm* — W. Eric Webostad

(57) ABSTRACT

An apparatus includes an integrated circuit with a clock network in an array of circuit blocks. The clock network includes routing tracks, distribution spines, and clock leaves. The routing tracks and the distribution spines are bidirectional.

19 Claims, 25 Drawing Sheets

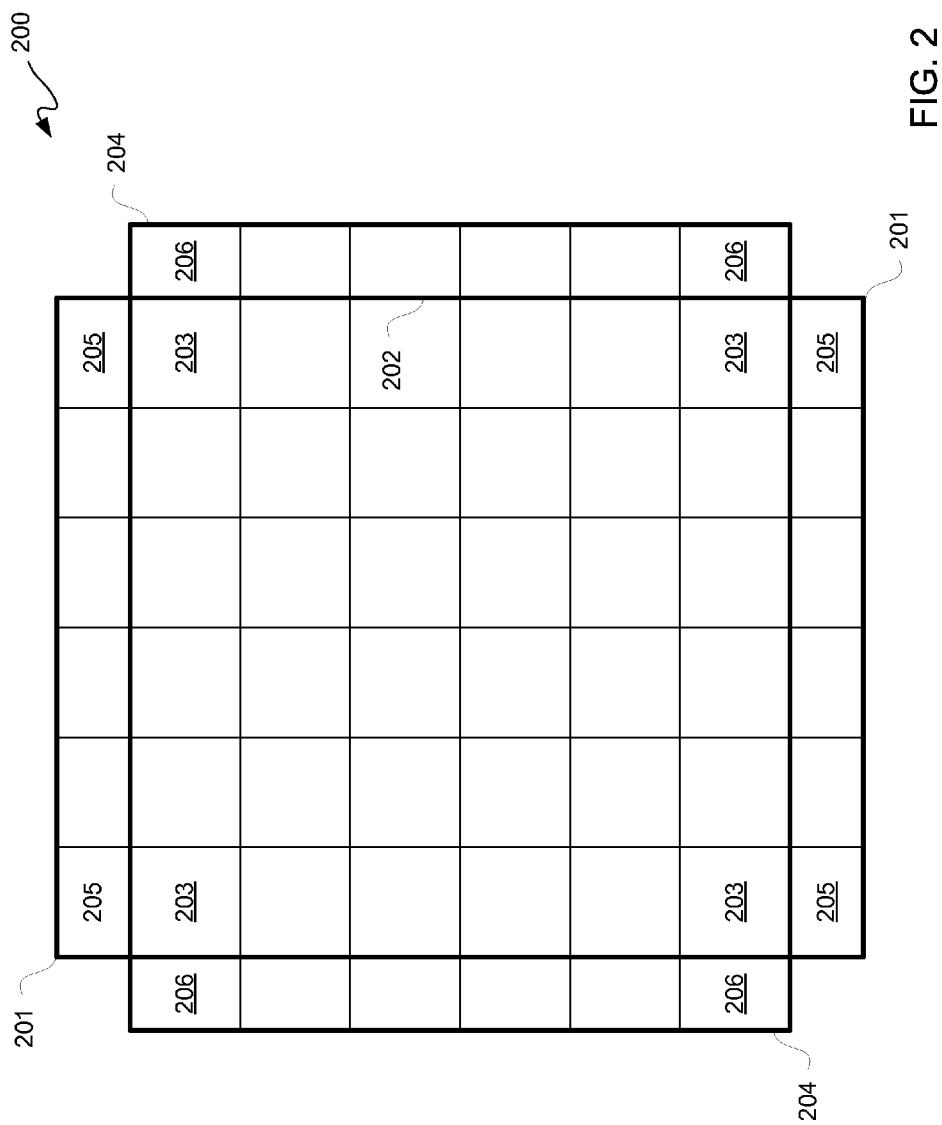

CLOCK NETWORK ARCHITECTURE

TECHNICAL FIELD

An embodiment relates to integrated circuit devices ("ICs"). More particularly, an embodiment relates to an architecture for a clock network for an IC.

BACKGROUND

Clock networks of programmable logic devices ("PLDs"), such as Field Programmable Gate Arrays ("FGPAs") for example, have used regional and global clocks. Conventionally, such regional clocks were driven only from an "edge" of such PLDs, and such global clocks were driven only from the center of such PLDs. This type of clock network architecture was considerably inflexible. However, as PLDs became larger, clock skew and/or clock delay, as well as increased timing uncertainty, became more of an issue, and such inflexibility made addressing one or more of these issues more problematic. Hence, it is desirable and useful to provide an IC that has more flexibility to reduce one or more of these issues.

SUMMARY

An apparatus includes an integrated circuit having a clock network in an array of circuit blocks. The clock network includes routing tracks, distribution spines, and clock leaves. The routing tracks and the distribution spines are bidirectional.

In another apparatus, an integrated circuit die has a network of clock routing resources and a clock source. A circuit design has a root of a clock domain. A routing track of the clock routing resources couples the clock source and the root. A first distribution spine of the clock routing resources is coupled to the routing track. A second distribution spine of the clock routing resources couples the first distribution spine and the clock source. The second distribution provides a feedback path for a clock signal.

In yet another apparatus, a first integrated circuit die has a first network of first clock routing resources. A first routing track of the first clock routing resources couples a clock source of the first integrated circuit die to a second routing track of the first clock routing resources. A second integrated circuit die has a second network of second clock routing resources. A third routing track of the second clock routing resources is coupled to the second routing track. A first root is coupled to the clock source via the first routing track and the second routing track. A second root is coupled to the clock source via the first routing track, the second routing track, and the third routing track. The first root is located on the first integrated circuit die. The second root is located on the second integrated circuit die.

BRIEF DESCRIPTION OF THE DRAWINGS

Accompanying drawings show exemplary block and circuit diagrams. However, the accompanying drawings should not be taken to limit the embodiments shown, but are for explanation and understanding only.

FIG. 2 is a block diagram depicting an exemplary integrated circuit.

FIGS. 8-1 and 8-2 are block/circuit diagrams depicting respective exemplary portions of an array of FSRs.

FIGS. 21-1 and 21-2 (together referred to herein as "FIG. 21") are circuit/block diagrams depicting an exemplary clock network for an FSR.

DETAILED DESCRIPTION

Figure 1:
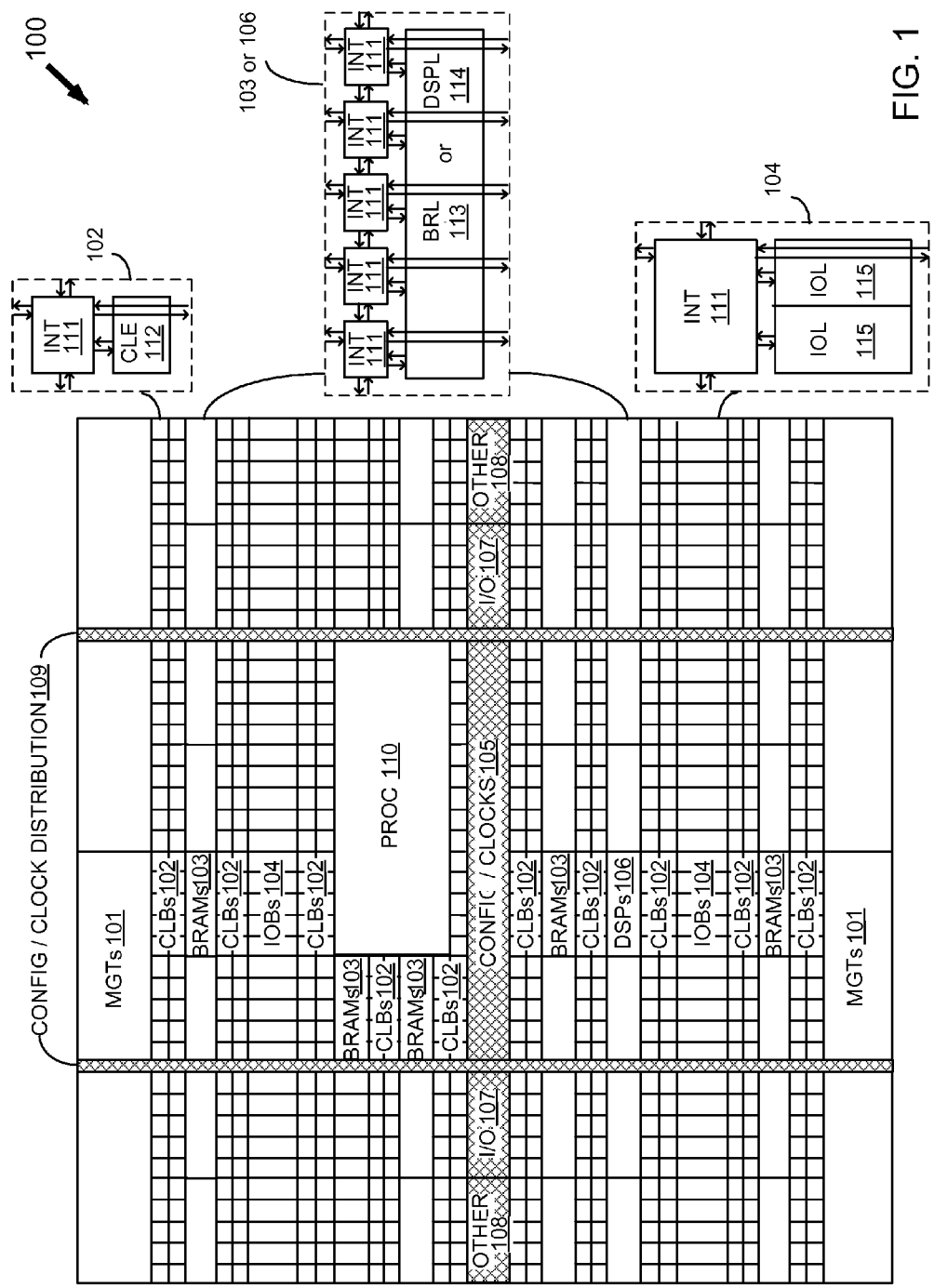
FIG. 1 is a simplified block diagram depicting an exemplary columnar Field Programmable Gate Array architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

As previously described, prior clock network architectures used specialized networks for regional and global clocks. Regional clocks were limited to being driven from an outside edge of an array of PLD programmable resources, and global clocks were limited to being driven from the center of such array.

With the above general understanding borne in mind, various exemplary clock network architectures are described below. As described below, functionality of regional and global clocking have been combined to allow a user to select from a pool of clock resources to tailor a clock network to a circuit design instantiated in programmable resources. This allows a circuit design instantiated in programmable resources to more closely resemble an application specific circuit. In other words, for example, a root need not be at the center of an integrated circuit die or the center of a layout of circuit resources of such integrated circuit die or any other such central location specific to an integrated circuit die, but may be located relative to a circuit design instantiated in programmable resources.

More particularly, a user may choose where to place a root of a clock distribution network with respect to such pool of clock resources. This allows a root to be placed almost anywhere within a circuit design instantiated in an integrated circuit, and thus is not bound by root locations of the integrated circuit itself. Generally, a root of a clock distribution network may be placed anywhere within a clock network, as described below in additional detail. To provide such placement, segmented and buffered clock tracks are provided. Optional delay elements of clock distribution spines may be used to at least approximately null out or equalize clock skew ("skew"). To reduce skew between adjacent clock segments, optional delay elements may be used to mitigate or avoid hold timing ("hold") issues.

Because one or more of the described circuits are exemplified using a particular type of IC, a detailed description of such an IC is provided below. However, it should be understood that other types of ICs having an array of programmable resources may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figures 1, 8:
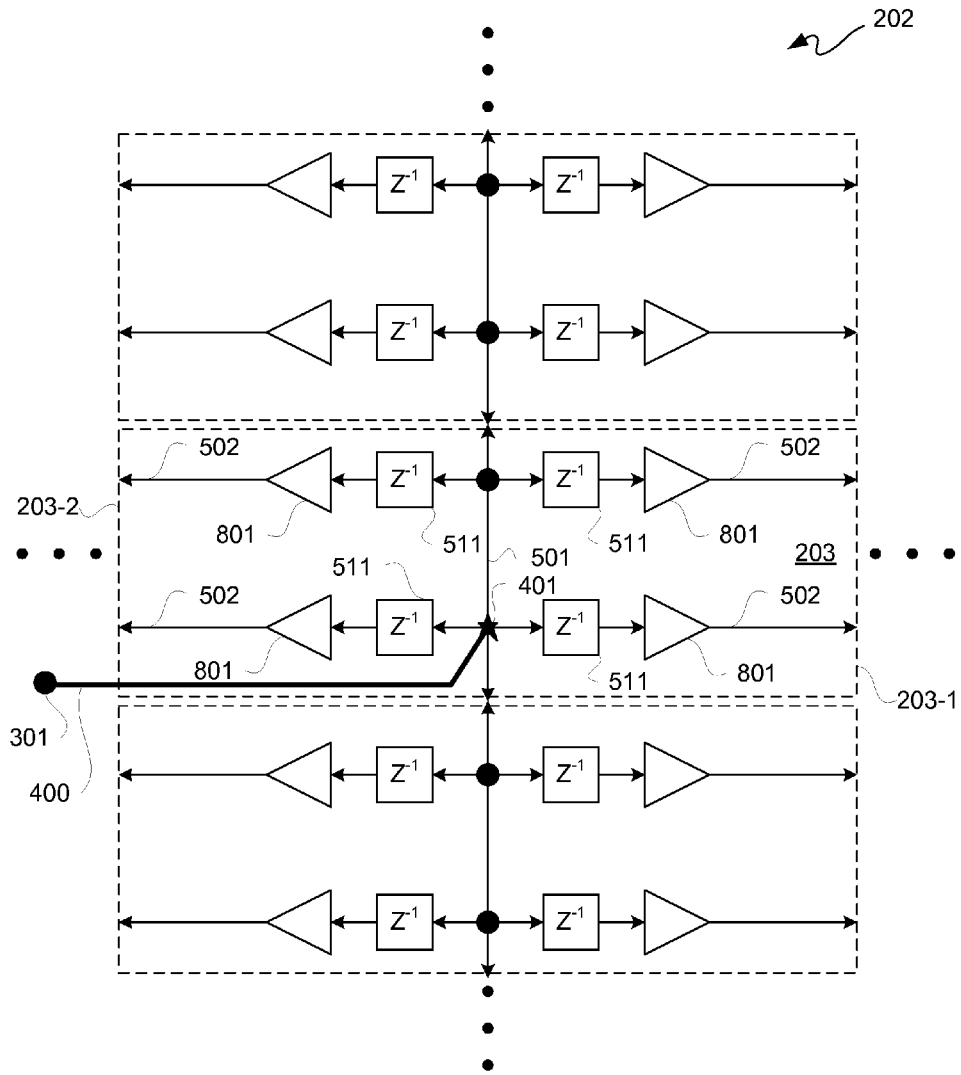
Figures 2, 8:
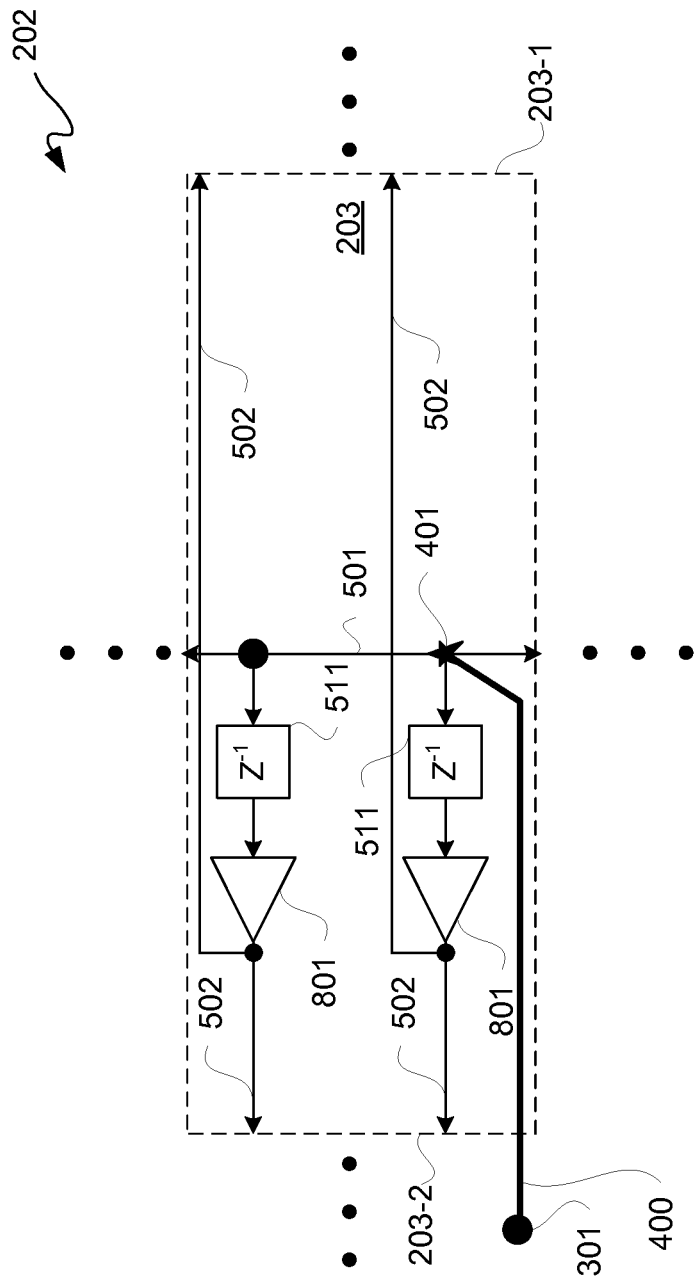

FIG. 2 is a block diagram depicting an exemplary integrated circuit 200. Such integrated circuit 200 may be an FPGA 100 of FIG. 1 or other integrated circuit having an array of programmable logic resources, as described below in additional detail.

Integrated circuit 200 includes an N-by-M array 202 of programmable resources. Programmable resources may include CLBs, programmable logic array blocks ("LABS"), or other form of fabric sub-regions ("FSRs") 203. Each FSR 203 may be approximately the same height and width and may include a same set of circuit resources, namely FSRs 203 may be repeats of one another.

Such array 202 of FSRs 203 may be bracketed top and bottom by arrays 201 of gigabit transceivers ("GTs") 205 and may be bracketed right and left by arrays 204 of IOBs 206, and vice versa. Arrays 201 and 204 may form parts of integrated circuit 200. IOBs 206 in an embodiment may be IOBs 104 of FIG. 1, and in an embodiment, GTs 205 may be MGTs 101 of FIG. 1. Even though specific sizes for arrays 201, 202, and 204 are illustratively depicted, these or other sizes for such arrays may be used in other embodiments.

Figure 3:
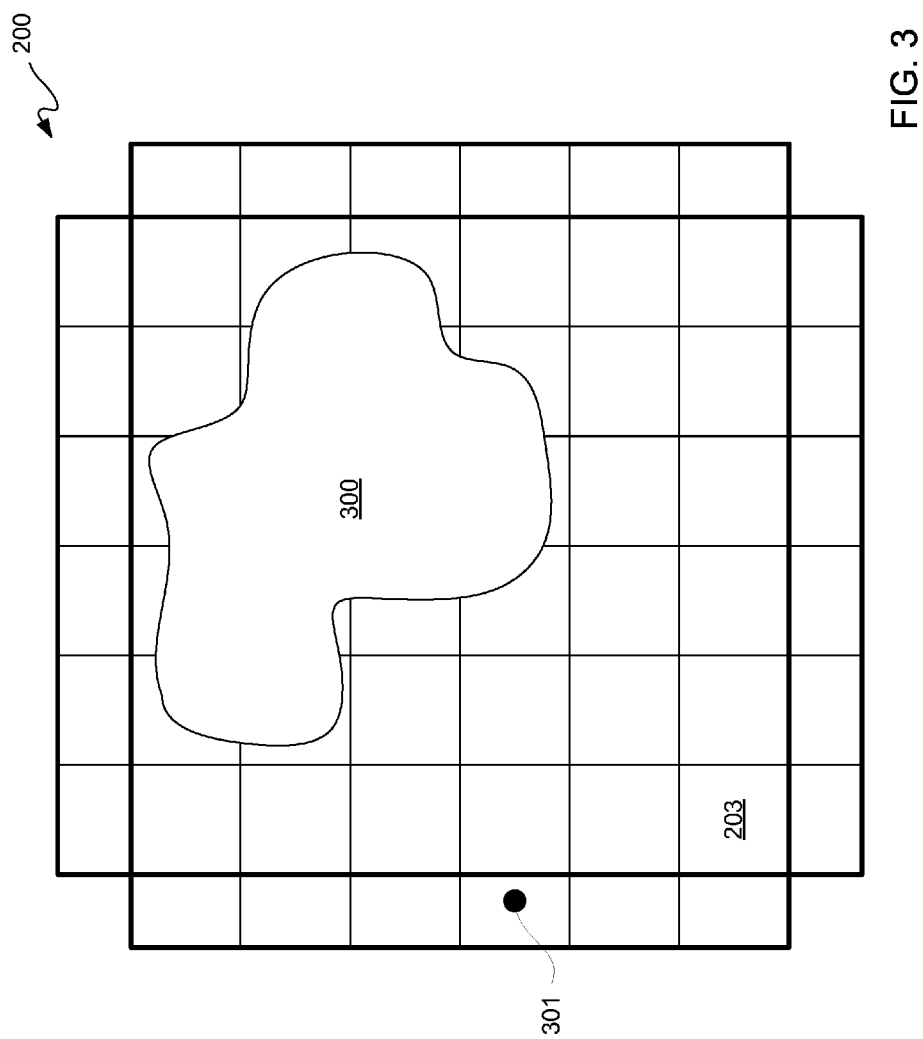
FIG. 3 is the block diagram of FIG. 2 with a depiction of an exemplary circuit instantiated in a subset of fabric sub-regions (FSRs).

FIG. 3 is a block diagram of FIG. 2 generally depicting a circuit ("circuit cloud") 300 instantiated in a subset of FSRs 203. Circuit cloud 300 may be an arbitrarily shaped logic cloud or circuit design. Furthermore, an IOB 206 generally depicts a clock source node ("clock source") 301. Clock load locations of circuit cloud 300 may be identified, along with clock source 301. By identifying clock load locations of circuit cloud 300, a clock network root ("root") 401 may be located proximate to a center of a clock distribution network of such circuit cloud 300. As generally indicated by a star, root 401 may be within a boundary of circuit cloud 300.

Array 202 may have a clock network, such as clock network 600 for example, including clock leaves and clock tracks. There are two types of clock tracks, namely, horizontal and vertical clock distribution spines ("distribution spines"), and horizontal and vertical clock routing tracks ("routing tracks").

Figure 4:
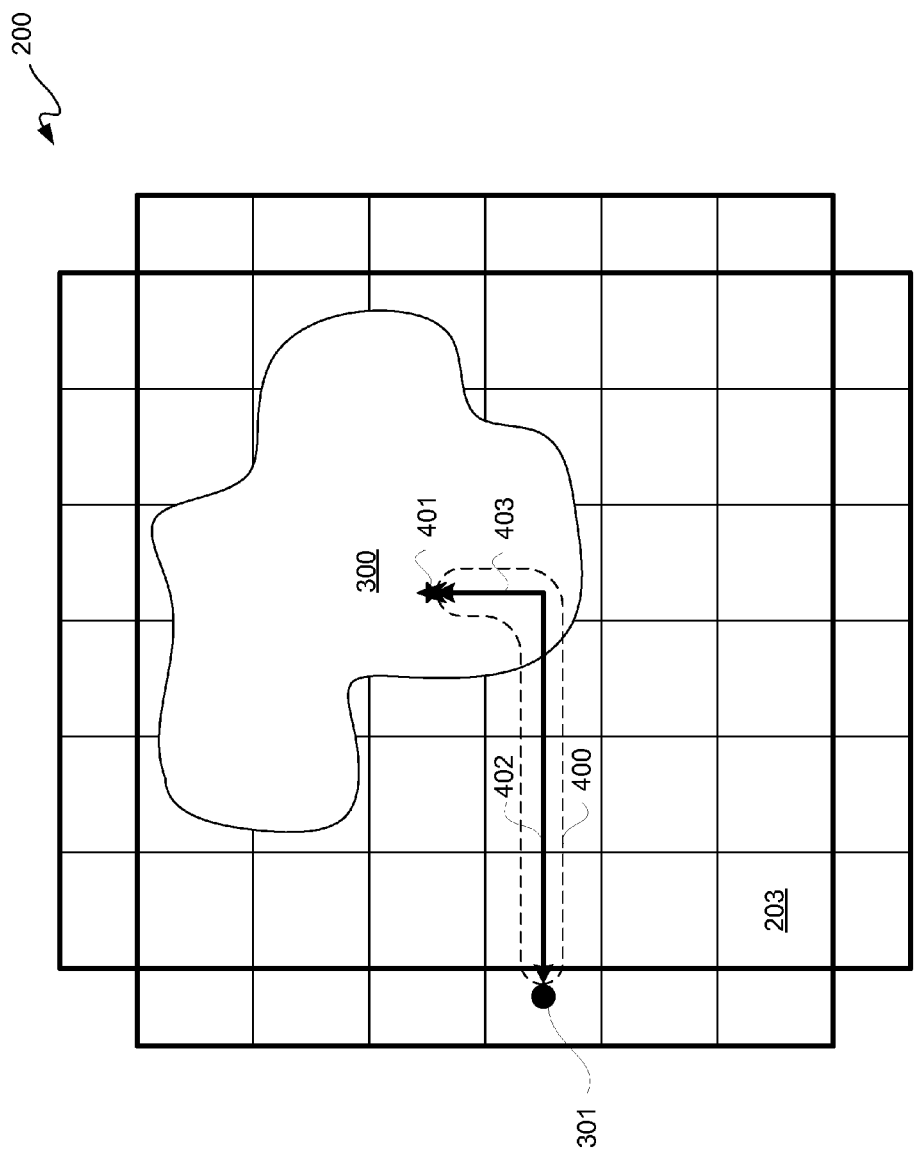
FIG. 4 is the block diagram of FIG. 3 with a depiction of an exemplary route from a clock source to a root.

With reference to FIG. 4, there is shown the block diagram of FIG. 3 depicting an exemplary route 400 from clock source 301 to root 401. Route 400 may be composed of one or more vertical routing tracks 402 and/or one or more horizontal routing tracks 403, and route 400 may be referred to as routing track 400. In an embodiment, routing tracks 402 and 403 are segmented at boundaries of FSRs 203, and such routing tracks 402 and 403 are bidirectional. In this exemplary embodiment, as route 400 extends to four FSRs 203 in a horizontal direction and to two FSRs 203 in a vertical direction, four horizontal routing tracks segments may be used to provide routing track 402, and two vertical routing tracks segments may be used to provide routing track 403. In other embodiments, different numbers of routing tracks segments may be used to provide a route from a clock source to a clock network root.

Routing tracks 402 and 403 are dedicated clock resources that may be used to provide a route 400 from a clock source 301 to any one or more horizontal and vertical distribution spine 502 intersections. In an embodiment, there are two such spine intersections per FSR 203. However, in other embodiments fewer or more than two spine intersections per FSR 203 may be provided.

To recapitulate, routing tracks, such as routing tracks 402 and/or 403, may be used to route a clock signal, using one or more dedicated clock resources, to a distribution clock network root, such as root 401, of a circuit design, such as circuit cloud 300. Generally, a clock network root of a circuit design is a location from which a clock emanates from a nearest common node perspective. By being able to route from a clock source 301 to a root 401 of circuit cloud 300, a clock network for an arbitrary number and arbitrarily shaped logic cloud may have a clock node generally "centered" to such a clock network of such logic cloud. The ability to provide routing to a root 401 facilitates a reduction of skew, and allows skew within a clock distribution network to be equalized, reduced, or nulled out. For example, by being able to centrally locate a common clock root node from which a clock signal emanates to other portions of a clock network, the greatest amount of delay in such propagation of such clock signal throughout such clock network may be reduced.

Even though nodes may be used to generally indicate intersections of routing tracks, distribution spines, and leaves, such intersections are not necessarily nodal in the sense of a direct metal intersection, but may rather involve circuitry for selective coupling two metal or other conductive lines, as described below in additional detail. Furthermore, even though continuous lines are used to generally indicate routing tracks and distribution spines, such routing tracks and distribution spines may be formed by segments of routing tracks and/or distribution spines, respectively, coupled to one another by circuitry, as described below in additional detail.

By separating routing tracks from distribution spines, routing tracks may be less skew sensitive. For example, routing tracks may be formed using thinner and narrower metal lines in order to use less space in a layout. Furthermore, by separating routing tracks from distribution spines, software placement algorithms may be simplified, because such software placement algorithms may treat such resources in routing/distribution pairs. However, in another embodiment, the same resource type may be used for both routing tracks and distribution spines, namely for both of these functions.

A root of a clock domain or clock distribution subnet may be a virtual point selected to meet parameters of a circuit cloud. Such root may be a central location from which such a clock distribution subnet fans out. Thus, a worst case for a root may be a nearest common node for any two paths in a clock tree or clock distribution subnet. One or more routing tracks may extend from a clock source node to one or more intersections of distribution spines. A root location of a circuit cloud may be determined to reduce or minimize clock skew. In an embodiment, a root location may be determined as a best location for minimizing clock skew. One or more routing tracks may be used to route a clock source to a clock network root of a circuit cloud for intersection with at least one distribution spine intersection. Routing tracks are dedicated clock tracks used to route a clock source to a root, and distribution spines are low-skew clock resources to distribute a clock signal from a root to clock loads via leaves. Along those lines, multiple clock source nodes may be coupled to multiple intersections of distribution spines using multiple routing tracks extending from such clock source nodes to such intersections.

Figure 5:
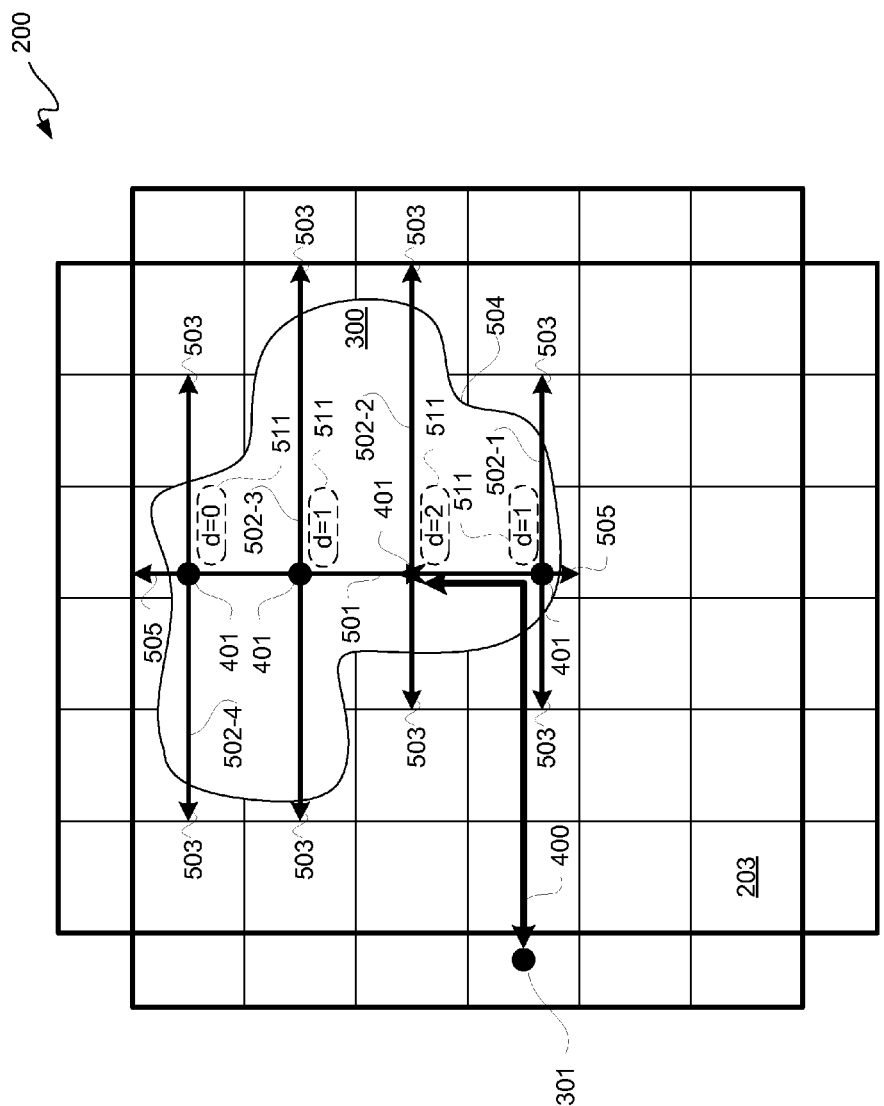
FIG. 5 is the block diagram of FIG. 4 with a depiction of exemplary vertical and horizontal distribution spines for a circuit cloud.

With reference to FIG. 5, there is shown the block diagram of FIG. 4 depicting exemplary vertical and horizontal distribution spines for circuit cloud 300. Route 400 to root 401 intersects vertical distribution spine 501. In other words, from root 401, a clock signal may be distributed vertically using vertical distribution spine 501. In the example of FIG. 5, vertical distribution spine 501 extends through four adjacent FSRs 203. Effectively, there are four vertical distribution spine segments used to provide vertical distribution spine 501 for this embodiment, as circuit cloud 300 extends into four FSRs in a vertical direction. Along those lines, one or more vertical distribution spine segments may be used to provide a vertical distribution spine. Distribution spines, both horizontal and vertical, are segmented at boundaries of FSRs 203.

Furthermore, distribution spines are bidirectional, as described below in additional detail.

In the pictured example, intersecting vertical distribution spine 501 are four horizontal distribution spines 502-1 through 502-4 ("distribution spines 502"). Fewer or more horizontal distribution spines 502 may be used in other embodiments. Distribution spine 502-1 is formed of three horizontal distribution spine segments corresponding to FSRs 203 into which a corresponding portion of circuit cloud 300 extends; distribution spine 502-2 is formed of four horizontal distribution spine segments corresponding to FSRs 203 into which a corresponding portion of circuit cloud 300 extends; distribution spine 502-3 is formed of five horizontal distribution spine segments corresponding to FSRs 203 into which a corresponding portion of circuit cloud 300 extends; and distribution spine 502-4 form of four horizontal distribution spine segments corresponding to FSRs 203 into which a corresponding portion of circuit cloud 300 extends.

To minimize or reduce vertical skew of a clock signal distributed using vertical distribution spine 501, optional delays 511 may be used. Such delays may be programmatically set in order to equalize vertical delay from a perspective of horizontal distribution spines intersecting a vertical distribution spine, namely horizontal distribution spines 502 intersecting vertical distribution spine 501 in this example. In this exemplary structure, there are four intersections 401 of horizontal distribution spines 502 to vertical spine 501, and one of these four intersections 401 is a root ("root 401") as indicated with a star. Root 401 has the most delay added in order to at least attempt to null out vertical skew. Intersections 401 nearest root 401 have the next most amount of delay added, and so on, where intersections 401 furthest from root 401 have the least amount of delay added. In other words, horizontal distribution spine 502-2 has the most amount of delay added, where delay 511 associated with horizontal distribution spine 502-2 has a unit interval delay equal to two; horizontal distribution spines 502-1 and 502-3 have the next most amount of delay added, where delays 511 associated with such horizontal distribution spines have a unit interval delay equal to one; and horizontal distribution spine 502-4 has the least amount of delay added, where delay 511 associated with horizontal distribution spine 502-4 has a unit interval delay equal to zero, namely no delay is added. Generally, delay may be added at a root and progressively decreased in any direction away from such root at one or more subsequent intersection nodes.

Portions 505 of vertical segments of vertical distribution spine 501 may extend beyond a clock domain perimeter 504 of circuit cloud 300. Likewise, portions 503 of horizontal segments of horizontal distribution spines 502 may extend beyond perimeter 504 of circuit cloud 300.

Figure 6:
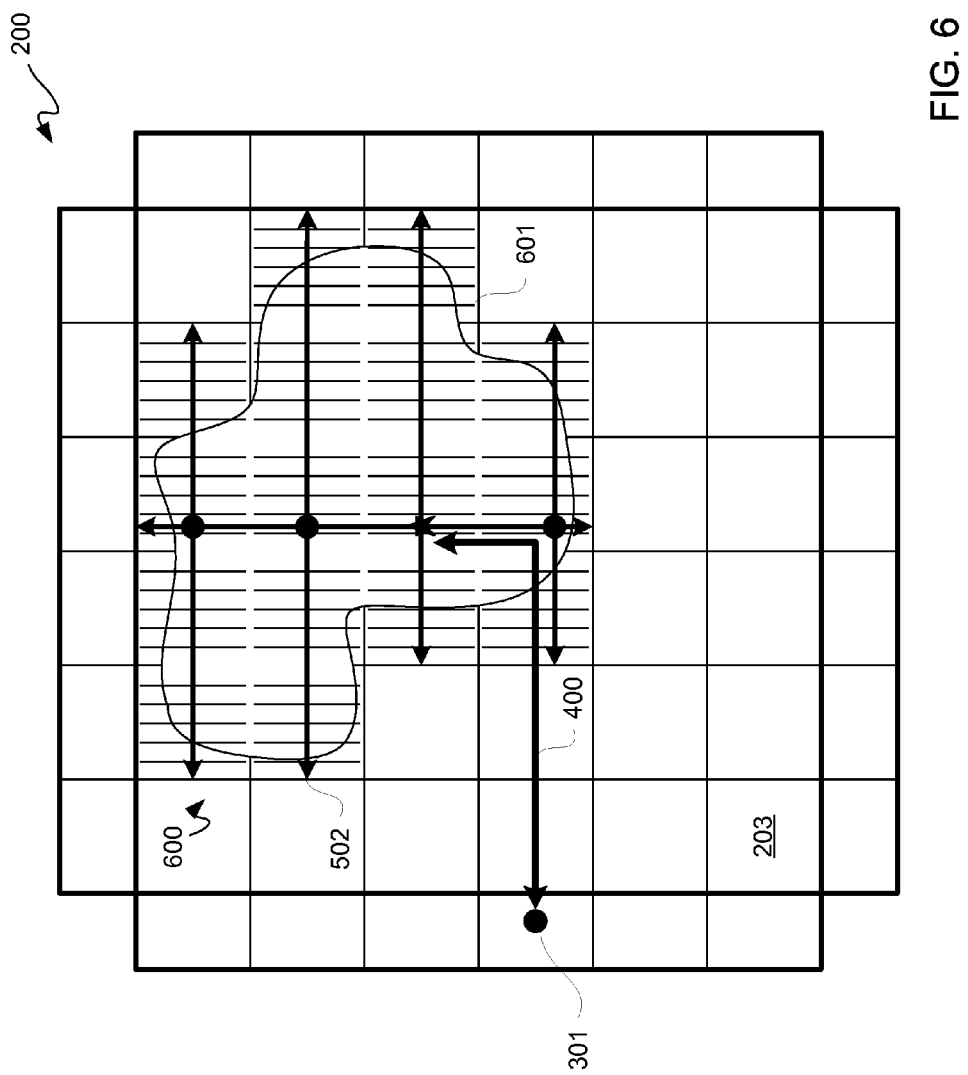
FIG. 6 is the block diagram of FIG. 5 with a depiction of exemplary clock leaves of a clock network.

FIG. 6 is the block diagram of FIG. 5 depicting exemplary clock leaves ("leaves") 601 of a clock network. Leaves 601 intersect horizontal segments of horizontal distribution spines 502. Portions of some leaves 601 within an FSR 203 may extend outside perimeter 504 of circuit cloud 300. Likewise, some leaves 601 in their entirety may be outside perimeter 504 of circuit cloud 300, even though circuit cloud 300 consumes a portion of an FSR 203 in which such leaves 601 outside of perimeter 504 are located. Leaves 601 are located within FSRs 203 and are segmented or bounded by borders of such FSRs 203.

To recapitulate, a clock source may be routed to a clock network root of a circuit cloud spanning one or more FSRs in either or both a horizontal or vertical direction using one or more routing tracks. Such clock source may be on-chip or off chip, and such clock source may be for providing a clock signal to or from an IOB or gigabit transceiver ("GT"). Furthermore, tiles, such as a column of tiles, may be used for routing from one die to another, and a root of a clock distribution may exist at any distribution spine intersection. Rather, a root may be specific to a circuit cloud instantiated by a user using programmable resources of such integrated circuit die. This provides a significant increase in the ability to tailor a clock distribution to a circuit cloud. Additionally, resources used to route to such root may be dedicated clock resources, such as routing tracks, which are not bound to a central location specific to an integrated circuit die. Furthermore, local interconnects may be used to route a clock signal onto dedicated clock resources of a clock network, such as routing tracks and/or distribution spines. By providing dedicated clock resources, such as routing tracks for example, a low skew route to a clock distribution network center or central location of a clock domain of a circuit cloud may be instantiated. However, a user may want to get to clock loads, such as registers for example, as directly as possible, and thus routing tracks may be skipped or bypassed to go directly from a clock source to one or more distribution spines for low injection delay routing.

To recapitulate, routing tracks are coupled to intersections of horizontal and vertical distribution spines. Such vertical distribution spines are not limited to a central location specific to an integrated circuit die, but are distributed throughout an array of programmable resources to promote varied locations of a root. Furthermore, vertical and horizontal distribution spines are bidirectional. Heretofore, a clock signal was routed to a central location specific to an integrated circuit die and then routed unidirectionally away from such central location. However, as a root may be located in a variety of locations within an array of programmable resources, or more particularly a clock network within such array of programmable resources, bidirectional capability of vertical and horizontal distribution spines allows for such variety of locations for a root. In other words, it is not determined a priori by an integrated circuit die layout where a clock root is going to be located for all circuit clouds instantiated using programmable resources of such integrated circuit die. Rather, for example, a vertical distribution spine may be selected from among a plurality of vertical distribution spines responsive to instantiation of a circuit cloud. From a root on a vertical distribution spine, a clock signal may be routed to one or more horizontal distribution spines and along such vertical distribution spine away from such root, and from a horizontal distribution spine, a clock signal may be routed to one or more leaves to reach clock loads within a circuit cloud.

Figure 7:
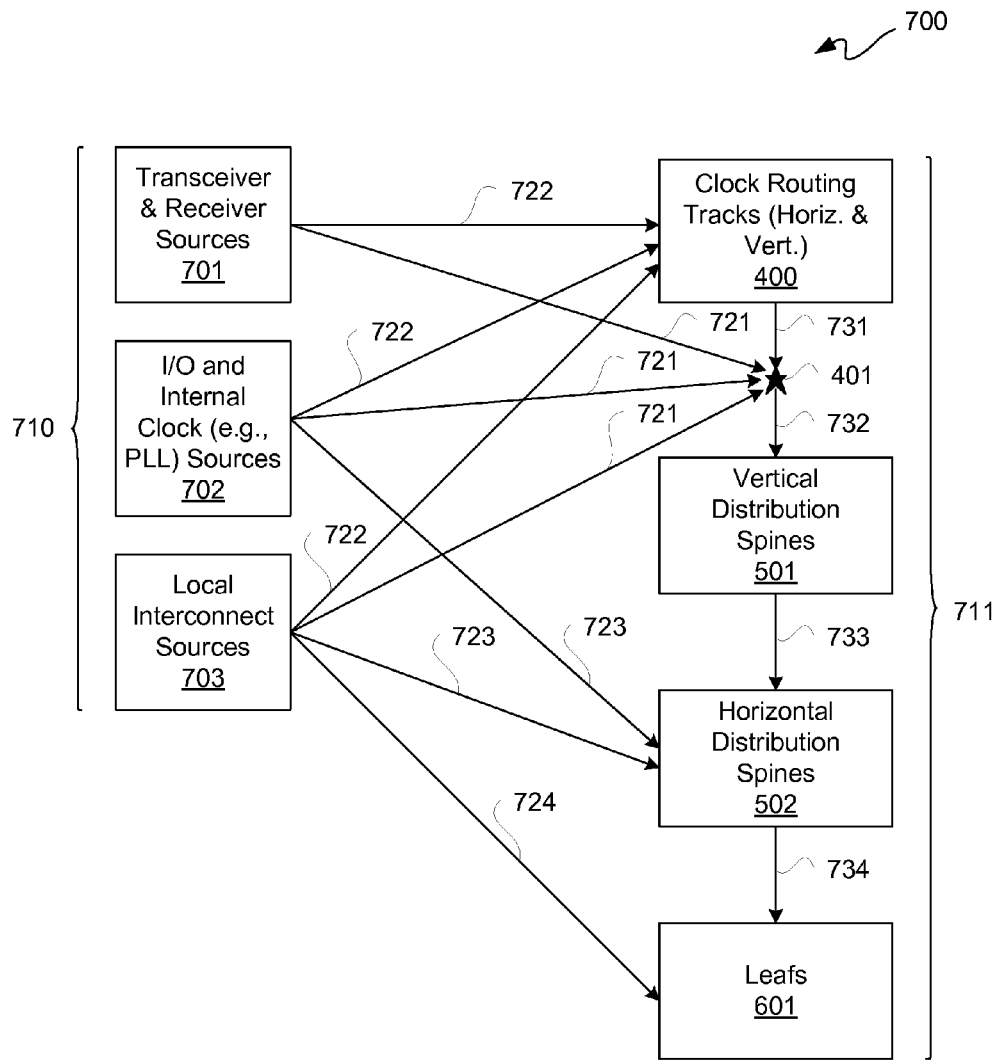
FIG. 7 is a block diagram depicting an exemplary clock routing hierarchy for the integrated circuit of FIG. 2.

FIG. 7 is a block diagram depicting an exemplary clock routing hierarchy 700 for the above-described integrated circuit 200 of FIG. 2. Clock routing hierarchy 700 includes clock sources 710 and clock network resources 711. Clock sources 710 include a pool of transceiver and receiver sources 701, a pool of I/O and internal clock sources 702, and a pool of local interconnect sources 703. Clock network resources 711 include a pool of clock routing tracks 400, including without limitation horizontal and vertical clock routing tracks 400, vertical distribution spines 501, horizontal distribution spines 502, leaves 601, and intersections 401 for one or more roots. As previously described, from clock routing tracks 400, a clock signal may be passed to an intersection, which may be a root 401, as generally indicated by arrow 731. From a root 401, such clock signal may be passed to one or more vertical distribution spines 501, as generally indicated by arrow 732. From vertical distribution spines 501, a clock signal may be passed to one or more horizontal distribution spines 502, as generally indicated by arrow 733. Lastly, from horizontal distributions spines 502, a clock signal may be passed to one or more leaves 601, as generally indicated by arrow 734.

From a pool of transceiver and receiver sources 701, a pool of I/O and internal clock sources 702, or a pool of local interconnect sources 703, a clock signal as generally indicated by arrows 722 may be directly passed using one or more resources from a pool of clock routing tracks 400. Internal clock sources 702 may include a PLL, DLL, or other internal clock source.

From a pool of transceiver and receiver sources 701, a pool of I/O and internal clock sources 702, or a pool of local interconnect sources 703, a clock signal as generally indicated by arrows 721 may be passed directly to at least one root 401 using local interconnects, or may be indirectly passed to at least one root 401 using one or more resources from a pool of clock routing tracks 400 as generally indicated by arrows 722 and arrow 731 from pool of clock routing tracks 400 to at least one root 401.

From a pool of I/O and internal clock sources 702 or a pool of local interconnect sources 703, a clock signal as generally indicated by arrows 723 may be directly passed using one or more resources from a pool of horizontal distribution spines 502. From a pool of local interconnect sources 703, a clock signal as generally indicated by arrow 724 may be directly passed using one or more resources from a pool of leaves 601.

FIG. 8-1 is a block/circuit diagram depicting an exemplary portion of an array 202 of FSRs 203. For an FSR 203, a left portion 203-2 is illustratively depicted with a right portion 203-1. Along those lines, it should be understood that an FSR 203 has horizontal distribution spines 502 that may be used to drive a clock signal right to left or left to right. From a root or an intersection 401 of a vertical distribution spine or segment 501 and a horizontal distribution spine or segment 502, a clock signal may be provided to an optional delay 511. Delays 511 are programmable, and thus may be optioned in or out of a circuit. However, the delay of such delays 511 may be a "fixed" delay provided by an inverter chain. Output of delays 511 may be respectively coupled to input of buffers 801, and output of buffers 801 may drive a clock signal onto horizontal distribution spines 502. Although this example shows a pair of delays 511 and a pair of buffers 801 for each horizontal distribution spine 502, in another embodiment, a single delay 511 and a single buffer 801 may be used for each horizontal distribution spine 502, as illustratively depicted in the block/circuit diagram of FIG. 8-2 which depicts an exemplary portion of an array 202 of FSRs 203.

By using multi-tap optional inverter chains for delays 511, a virtual zero delay vertical spine 501 may be formed. Delay may be generally equalized to within approximately 150 picoseconds for each horizontal distribution spine by progressively adding more delay to nodes closer to root 401. Inverter chains may not perfectly match one another such as due to metal versus transistor delay over process-voltage-temperature variation, and thus there may be some variability of delay of a vertical distribution spine 501. However, a reduction in vertical skew may be obtained, which reduction may be more pronounced for nodes 401 further away from a root node 401.

FIGS. 9 through 14 are block diagrams depicting respective exemplary clock networks in accordance with the above-description of FIGS. 1 through 8-2 for a multi-die system 900. FIGS. 9 through 14 are described below with simultaneous reference to FIGS. 1 through 14. Thus, a low skew clock replaces a global clock, and a low injection clock replaces a regional clock. Though specific examples of low skew clocks and low injection clocks are provided, such types of clocks may be combined in a clock network. With reference to low injection clocks, by routing a source directly to a clock distribution spine and bypassing any clock routing tracks, a low injection delay clock may be provided, which for example may be useful for I/O-to-fabric communication.

Integrated circuit die 910 includes a column of I/O banks 902, a column of clocking blocks 903 respectively associated with I/O banks 902, columns of FSRs 203, and a PCIe/configuration blocks ("PCIe blocks") column 904 located between columns of FSRs 203. Columns of FSRs 203 and a PCIe blocks column 904 are both part of a fabric array 914 of integrated circuit die 910. In an embodiment, a separate GT die 901 may be coupled to integrated circuit die 910 through an interposer (not shown here).

Figure 9:
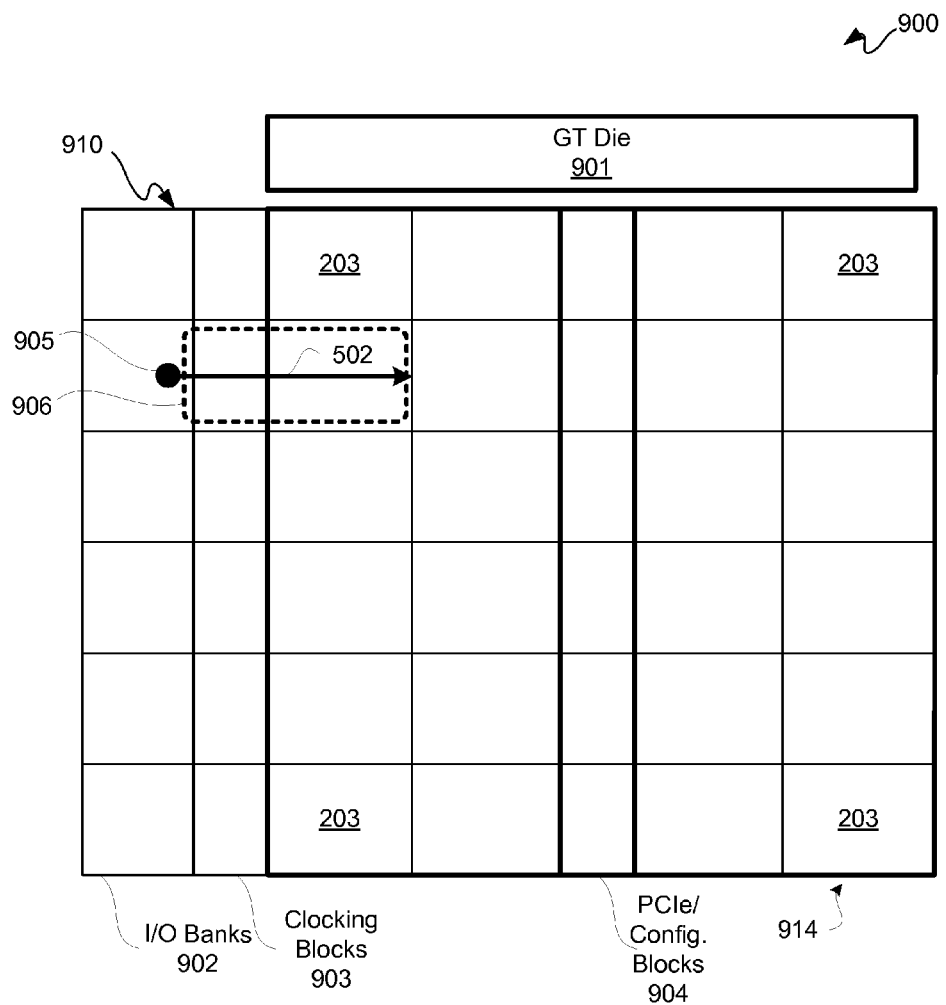
FIGS. 9 through 20 are block diagrams depicting respective exemplary clock networks in accordance with the above description of FIGS. 1 through 8-2 for a multi-die system.

For a clock network of FIG. 9, a clock source 905 of an I/O bank 902 is directly coupled to a horizontal distribution spine 502 for a clock domain 906. Clock domain 906 extends from such I/O bank 902 to a corresponding clocking block 903 and to an adjacent FSR 203. Clock domain 906 is for a low injection regional I/O clock. For a low injection clock, generally routing tracks 400 are not employed.

Figure 10:
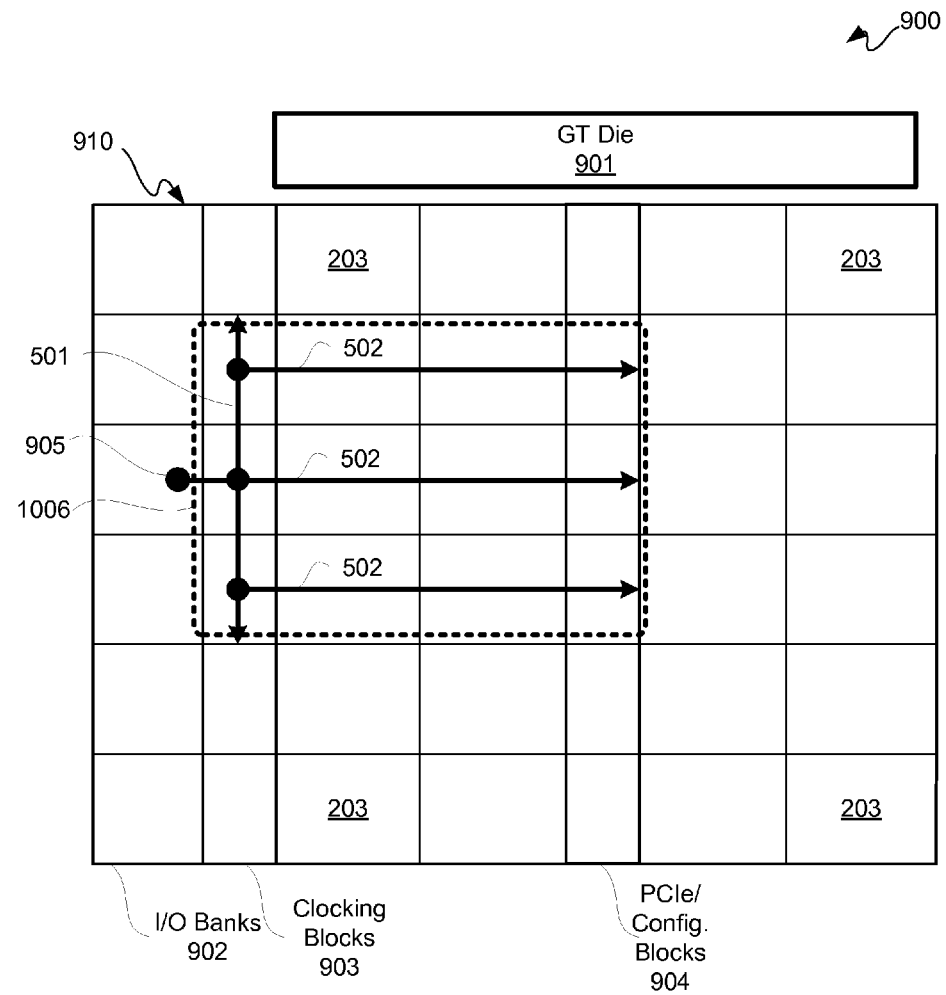

For a clock network of FIG. 10, a clock source 905 of an I/O bank 902 is directly coupled to a horizontal distribution spine 502 for a clock domain 1006. Clock domain 1006 is for a low injection regional I/O clock. Clock domain 1006 includes three vertical sub-regions and three horizontal sub-regions. From such I/O bank 902 to a corresponding clocking block 903 and to two adjacent FSRs 203 and a PCIe block 904, a horizontal distribution spine 502 is used. A vertical distribution spine 501 in a column of clocking blocks 903 is used to extend the clock domain up and down one row to corresponding horizontal distribution spines 502 in those rows.

Figure 11:
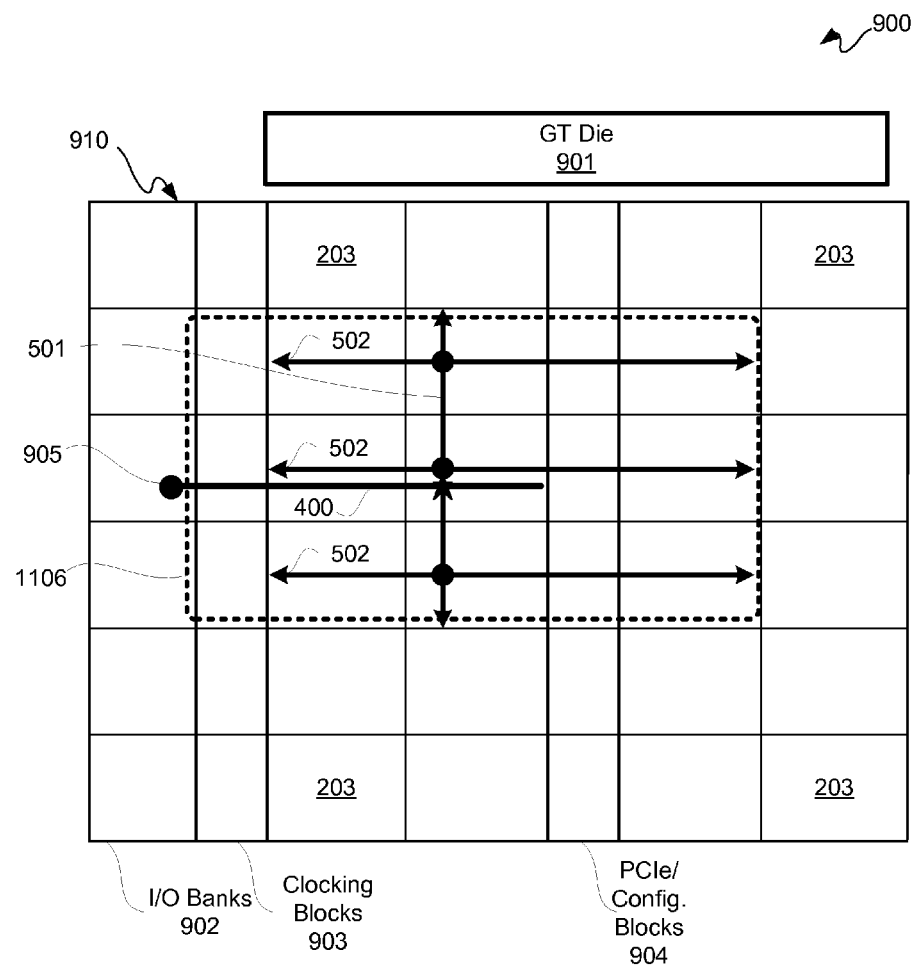

For a clock network of FIG. 11, a clock source 905 of an I/O bank 902 is directly coupled to a horizontal distribution spine 502 for a clock domain 1106. Clock domain 1106 is for a low skew clock from an I/O bank 902. Clock domain 1106 includes three vertical sub-regions and four horizontal sub-regions. From such I/O bank 902 to a corresponding clocking block 903 and to two adjacent FSRs 203, a routing track 400 is used. Root 401, which is in a second FSR column from the left, is indicated as two separate nodes for clarity though these nodes are the same node. Root 401 is at intersection of vertical distribution spine 501 and a horizontal distribution spine 502. Vertical distribution spine 501 in such column of FSRs 203 is used to extend the clock domain up and down one row to corresponding horizontal distribution spines 502 in those rows.

Figure 12:
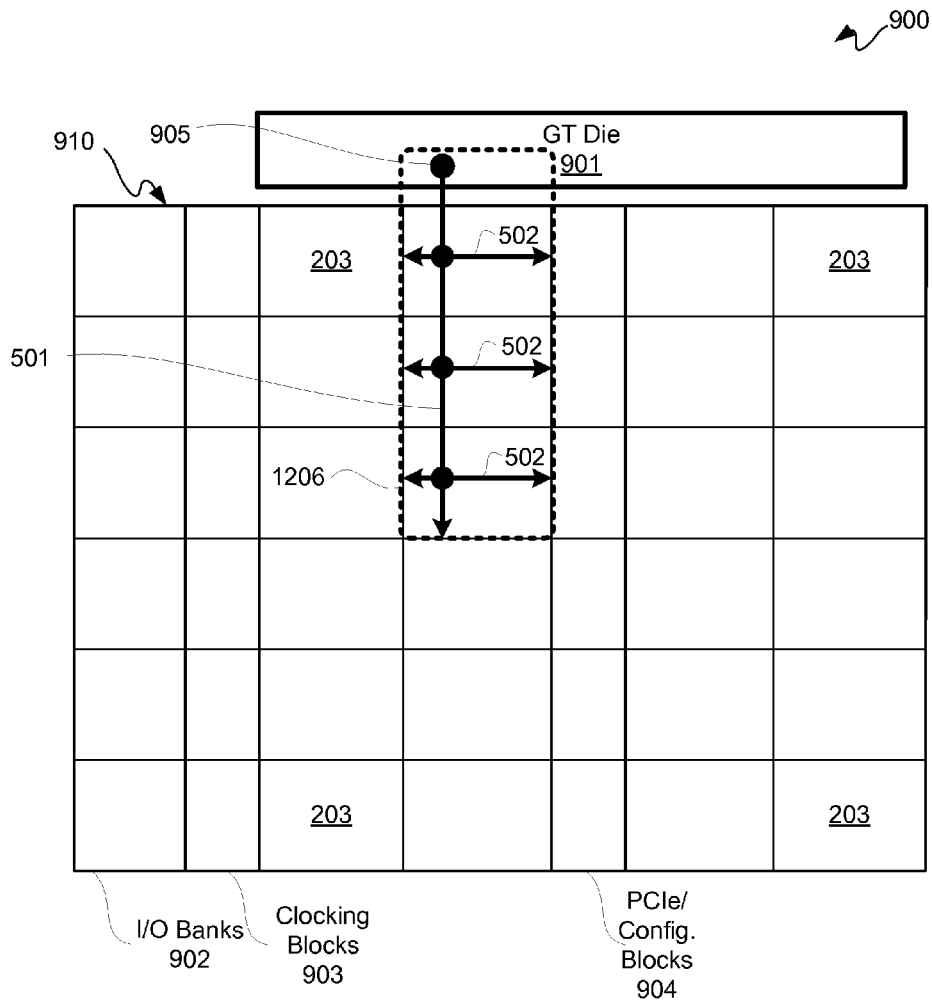

For a clock network of FIG. 12, a clock source 905 of a GT die 901 is coupled to a vertical distribution spine 501 of integrated circuit die 910 for a clock domain 1206. Clock domain 1206 is for a low injection GT regional clock from a GT of GT die 901. Clock domain 1206 includes three vertical sub-regions and one horizontal sub-region. From a GT of GT die 901, a clock signal is passed to integrated circuit die 910 using vertical distribution spine 501 to a column of FSRs 203. Three adjacent FSRs 203 are used in this example, along with three corresponding horizontal distribution spines 502 intersecting such vertical distribution spine 501. There may be a low enough latency between GT die 901 and programmable resource fabric of integrated circuit die 901 so as not to use a return user clock to transfer data, assuming there is an internal reference clock to user clock path and assuming optional delays on vertical distribution spine 501 are not used.

Die-to-die interconnecting of vertical distribution segments used to provide vertical distribution spine 501 may be provided by resources in an outer most row of fabric array 914. Thus, throughout the width of an array of an IC die-to-die interconnects may be used, which allows for more localized access by a die to clocks coming from an FPGA die coupled thereto. Thus, specific off-die interconnects may be provided for interfacing with another die. An interposer (not shown here) or a circuit board (not shown) may be used for wiring such interconnects.

Figure 13:
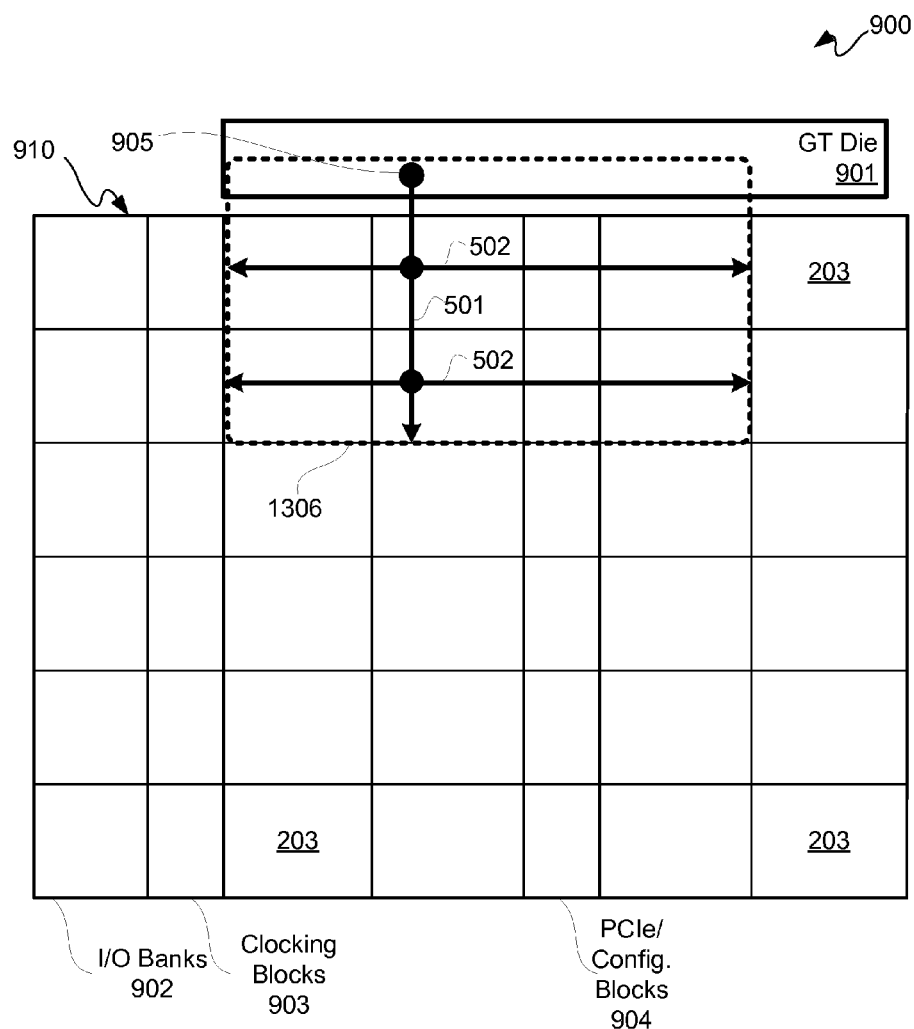

For a clock network of FIG. 13, a clock source 905 of a GT die 901 is coupled to a vertical distribution spine 501 of integrated circuit die 910 for a clock domain 1306. Clock domain 1306 is for a low injection, multi-region GT clock from a GT of GT die 901. Clock domain 1306 includes two vertical sub-regions and four horizontal sub-regions. From a GT of GT die 901, a clock signal is passed to integrated circuit die 910 using vertical distribution spine 501 to a column of FSRs 203. Two adjacent FSRs 203 are used in this example, along with two corresponding horizontal distribution spines 502 intersecting such vertical distribution spine 501. Such horizontal distribution spines 502 extend to one column of FSRs 203 to the left and two columns to the right, namely a PCIe/configuration blocks column 904 and a column of FSRs 203.

Figure 14:
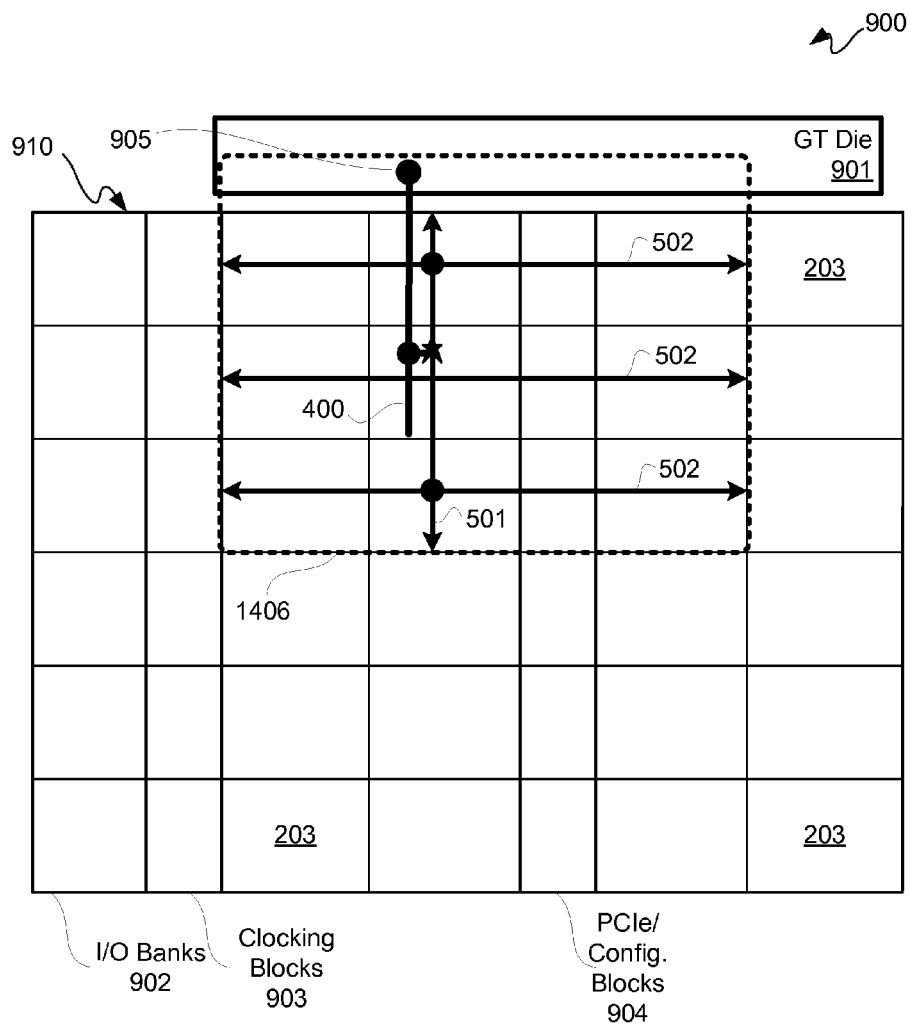

For a clock network of FIG. 14, a clock source 905 of a GT die 901 is coupled to a vertical distribution spine 501 of integrated circuit die 910 for a clock domain 1406. Clock domain 1406 is for a low skew clock from a GT of GT die 901. Clock domain 1406 has the same topology as a global clock, as previously described. Clock domain 1306 includes three vertical sub-regions and four horizontal sub-regions. From GT die 901 through two adjacent FSRs 203, a routing track 400 is used. Root 401, which is in a second FSR column from the left, is indicated as two separate nodes for clarity though these nodes are the same node. Root 401 is at intersection of vertical distribution spine 501 and a horizontal distribution spine 502. Vertical distribution spine 501 in such column of FSRs 203 may be used to extend the clock domain up and down one row to corresponding horizontal distribution spines 502 in those rows.

FIGS. 15 through 20 are block diagrams depicting respective exemplary clock networks in accordance with the above description of FIGS. 1 through 8-2 for a multi-die system 1500. FIGS. 15 through 20 are described below, with simultaneous reference to FIGS. 1 through 20.

Figure 15:
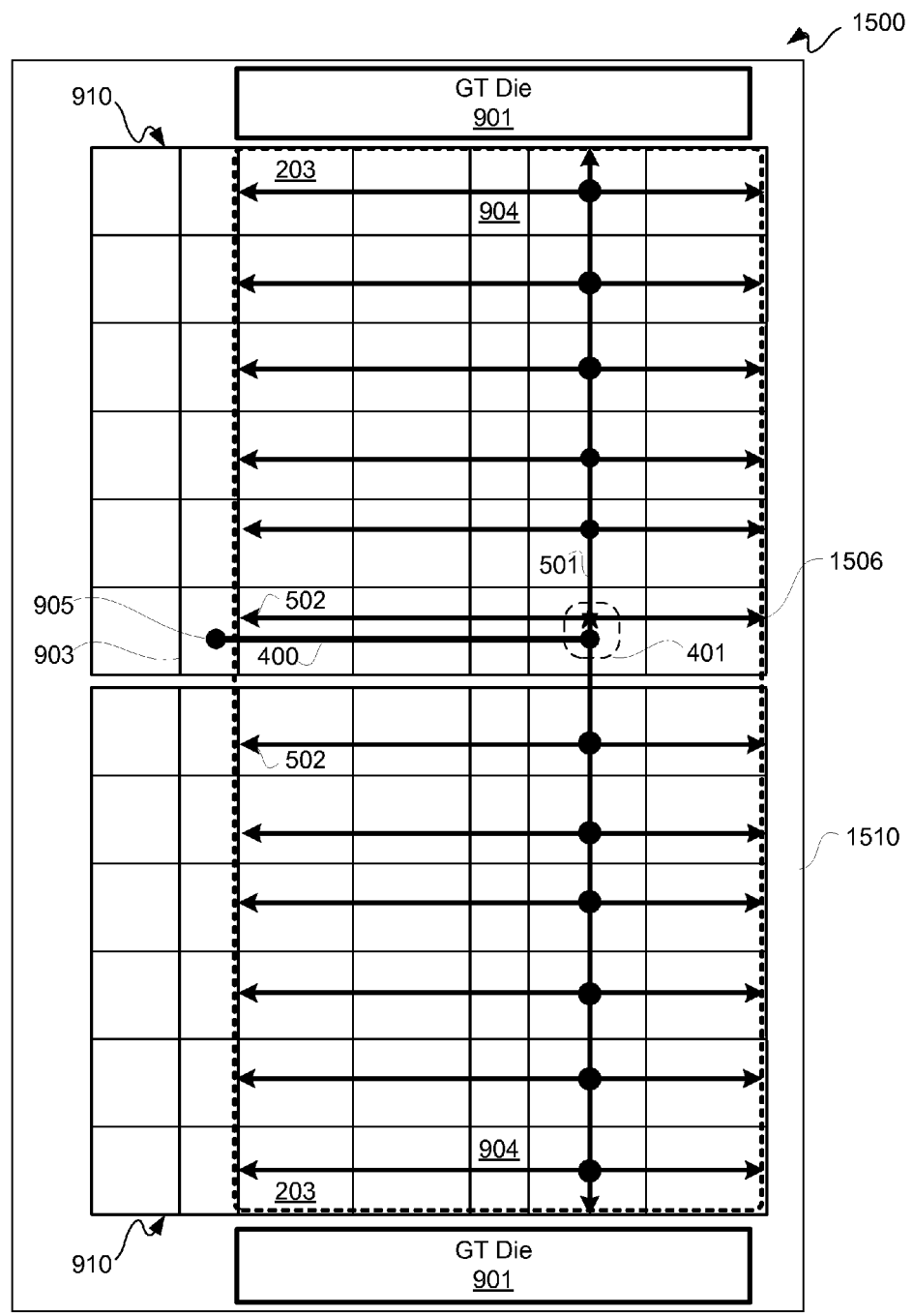

With reference to FIG. 15, multi-die system 1500 includes two integrated circuit die 910 and two GT die 901 coupled to an interposer 1510. A clock source 905 in a clocking block 903 of a top integrated circuit die 910 is coupled to a routing track 400 for coupling to a root 401. Root 401 is coupled to a vertical distribution spine 501 that extends up to an uppermost row of FSRs 203 of upper integrated circuit die 910 and down to a lowermost row of FSRs 203 of lower integrated circuit die 910. Die-to-die interconnecting of vertical distribution segments used to provide vertical distribution spine 501 may be provided by resources in an outer most row of fabric array 914. Thus, specific off-die interconnects may be provided for interfacing with another die. Interposer 1510 may be used for wiring such interconnects.

Horizontal distributions spines 502 of both integrated circuit dies 910 intersecting vertical distribution spine 501 are used to propagate a clock signal to other FSRs 203 and to PCIe blocks 904. Clock domain 1506 thus spans fabric arrays 914 of both integrated circuit dies 910.

Figure 16:
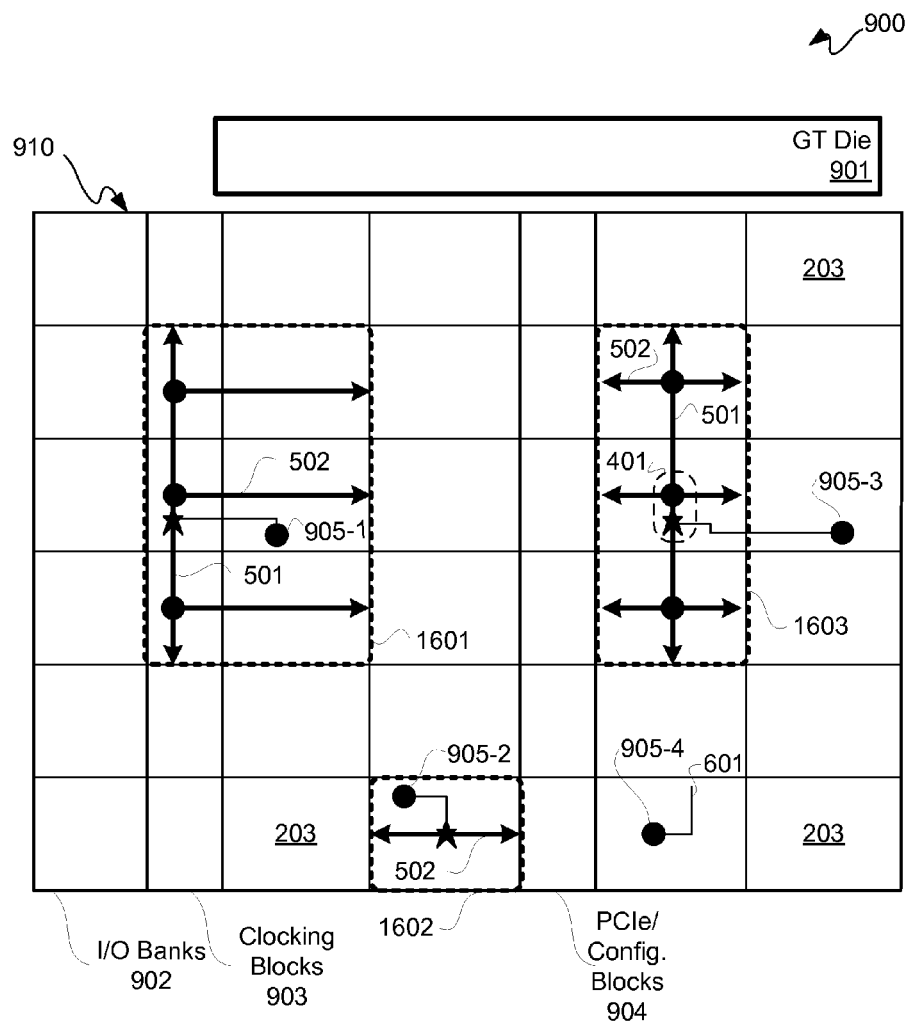

With reference to FIG. 16, four different clock network topologies are illustratively depicted. Such topologies are for high fanout interconnects, where interconnect clocks are used. In a topology, a clock source 905-4 is coupled to a leaf 601 using local interconnect routing. In such topology, clock source 905-4, leaf 601, and local interconnect routing are all located in a same FSR 203.

Clock domain 1601 is similar to clock domain 1006 for a single column of FSRs 203, except that a clock source 905-1 is in an FSR 203. From clock source 905-1, local interconnect routing may be used to reach a buffer of an I/O clocking block 903 to create an I/O or low skew clock. Clock domain 1602 is confined to a single FSR 203, where a clock source 905-2 in such FSR 203 is coupled to a horizontal distribution spine 502 using local interconnect routing.

Clock domain 1603 has a clock source 905-3 in an FSR 203, which is coupled to a root 401 in an FSR 203 in an adjacent column using local interconnects. Root 401 is coupled to a vertical distribution spine 501. Vertical distribution spine 501 has three segments for spanning three FSRs 203 in such adjacent column for clock distribution using horizontal distributions spines 502.

Figure 17:
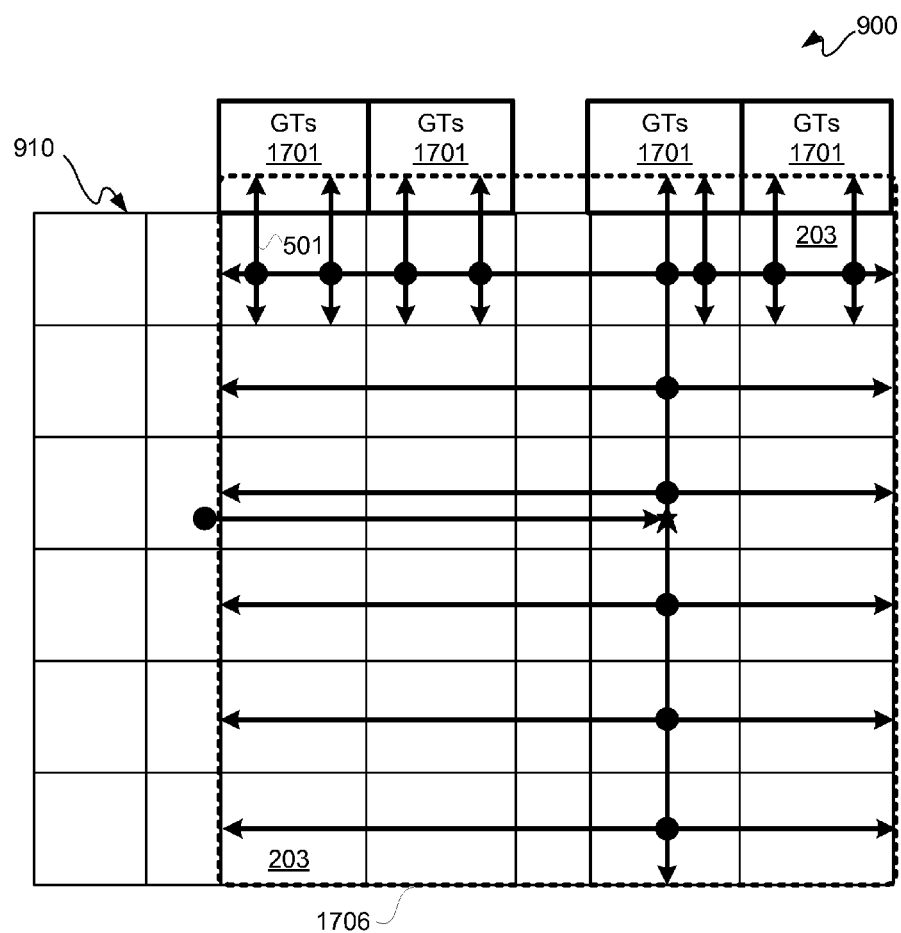

With reference to FIG. 17, an outer row of fabric array 914 may have resources for die-to-die interconnects to allow vertical distribution spines 501 to be interconnected off-chip. Such resources may likewise be used for coupling to GTs 1701 of a monolithic integrated circuit die 910. Thus, vertical distribution spines 501 may be used to couple to GTs 1701. GTs 1701 resources may be grouped corresponding to columns of FSRs 203. Other details regarding clock domain 1706 are not described here to avoid repetition.

Various exemplary structures for die-to-die interconnects have been described. Accordingly, there are multiple ways to send a clock signal to from one die to another. Both of such dies may involve clock sinks or sources. Clock signals may be sent on distribution spines for low injection delay paths or sent on clock routing tracks to conserve distribution spines. Additionally, data strobes may be sent through vertical distribution spines by sending clock signals to data inputs.

Figure 18:
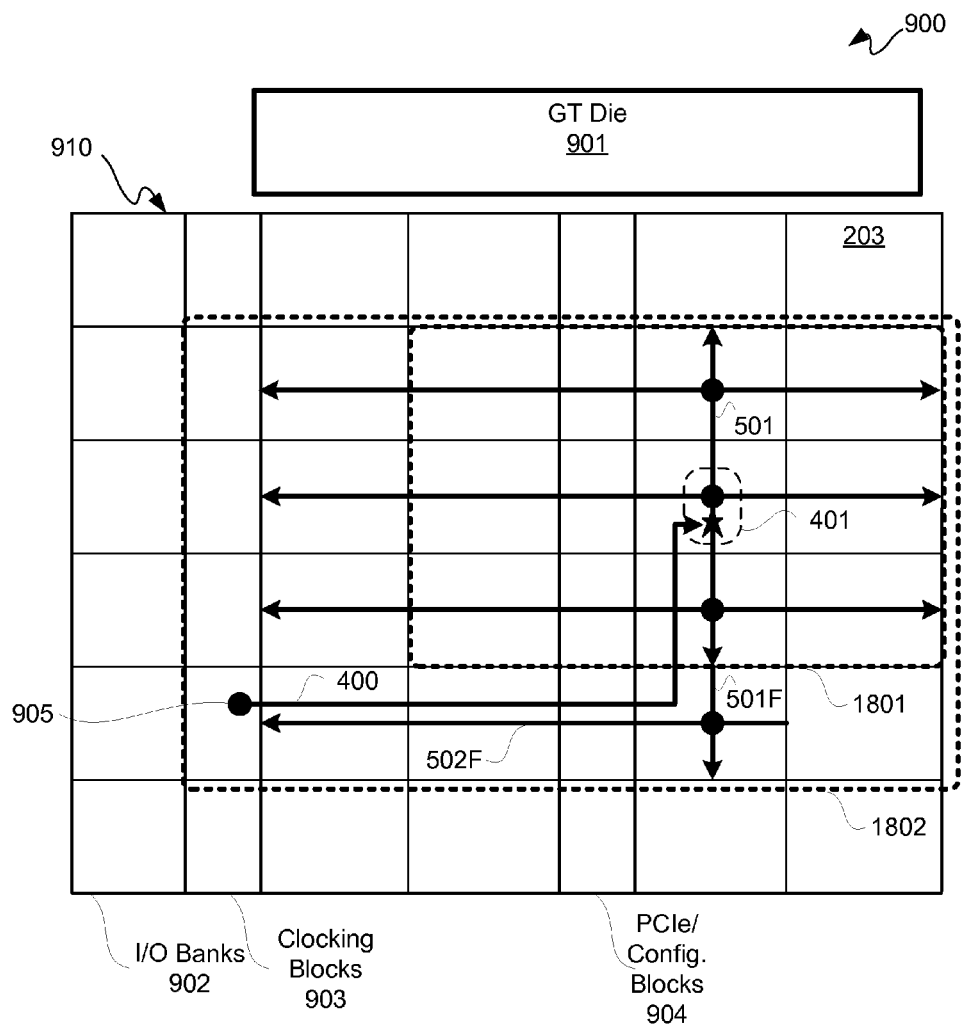

With reference to FIG. 18, a clock source 905 may be routed to a clock domain root 401 using a routing track 400 as previously described for a clock domain 1801. Such clock source 905 may be a clock manager, namely a block with a PLL for example. A horizontal distribution spine 502F in a same FSR row as routing track 400 may be used to feedback a clock signal to such clock manager for de-skewing. A feedback clock to a clock manager-PLL block may be provided via distribution spines, and not routing tracks, in order to delay such feedback clock to match delay of an actual clock distribution. For example, such feedback clock delay may be to match delay of an actual clock in instances where a clock network extends to a circuit boundary of a chip. Vertical distribution spine 501 of clock domain 1801 may be extended for such feedback with a vertical distribution spine 501F outside of clock domain 1801. Along those lines, a clock domain 1802 may encompass clock domain 1801 and routing to and from a clock manager clock source 905. Such a clock manager may be configured to adjust delay to account for variation among optional delays 511. Other details regarding clock domain 1801 are not described here to avoid repetition.

Accordingly, by tapping off any part of a vertical distribution spine onto a horizontal distribution spine that routes back to a clock source, feedback compensation may be provided. Because optional delays may be used, it may not matter where such vertical distribution spine is tapped.

Figure 19:
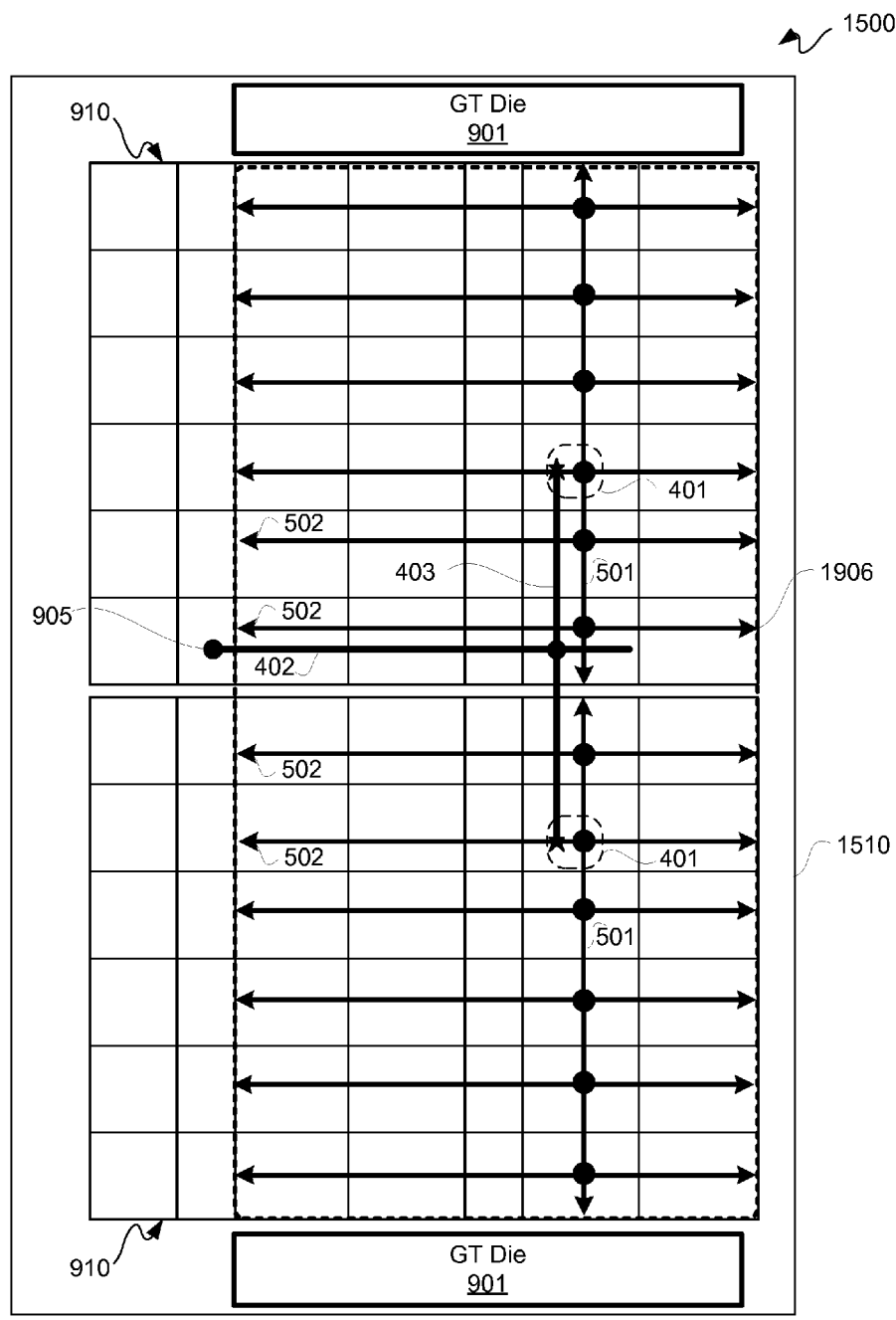

With reference to FIG. 19, clock domain 1906 is similar to clock domain 1506, except two clock domain roots 401 are used. In clock domain 1906, horizontal routing tracks 402 of an upper integrated circuit die 910 are coupled to vertical routing tracks 403 of upper and lower integrated circuit dies 910. Such vertical routing tracks 403 of both upper and lower integrated circuit dies 910 are used to couple clock source 905 to a root 401 of upper integrated circuit die 910 and to a root 401 of lower integrated circuit die 910. Accordingly, vertical distribution spines 501 of integrated circuit dies 910 are not interconnected. Other details regarding clock domain 1906 are not described here to avoid repetition.

Figure 20:
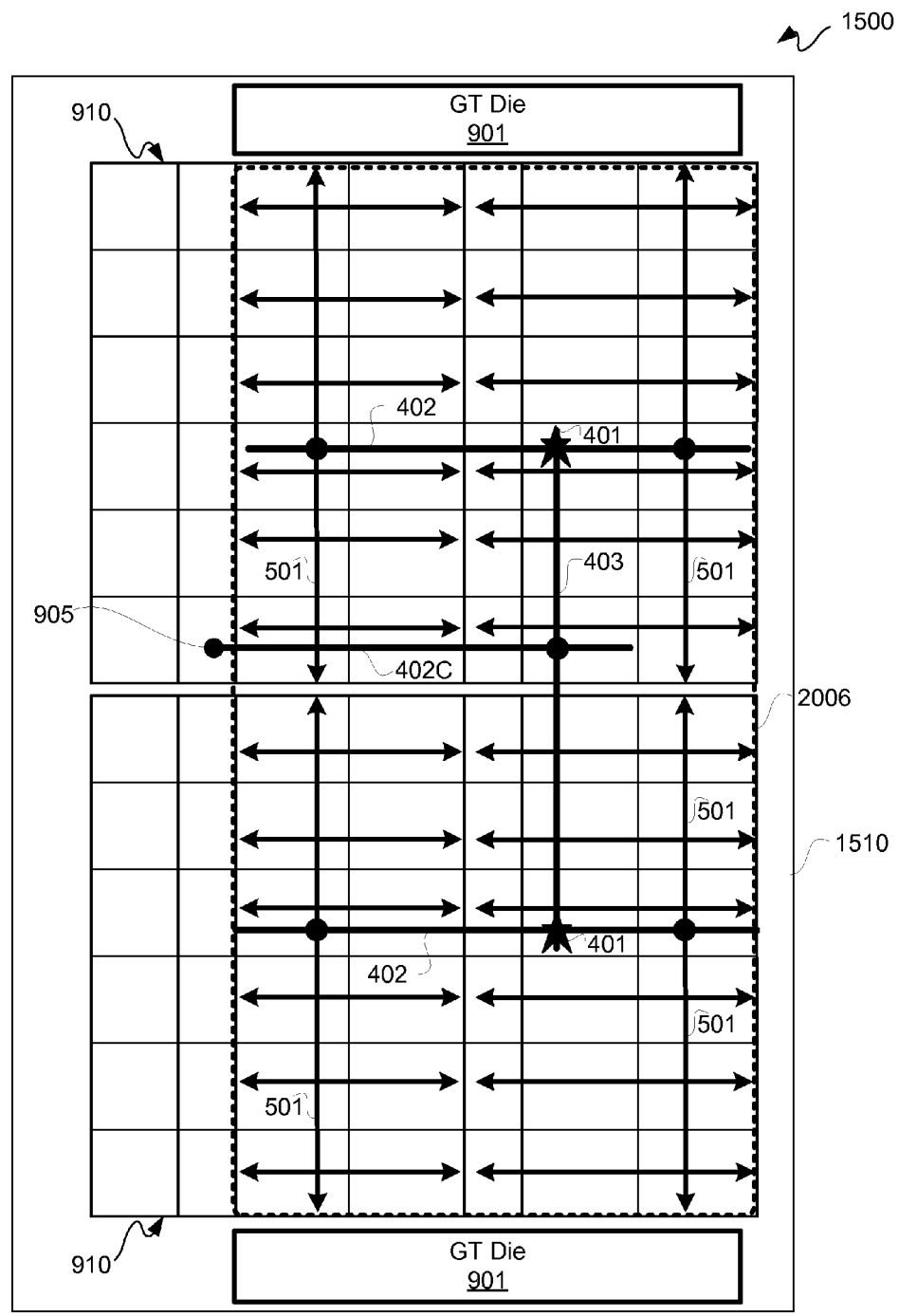

With reference to FIG. 20, clock domain 2006 is similar to clock domain 1906, with two clock domain roots 401 of a same clock network. In clock domain 2006, central horizontal routing tracks "402C" of an upper integrated circuit die 910 are coupled to vertical routing tracks 403 of upper and lower integrated circuit dies 910. Such vertical routing tracks 403 are used to couple to horizontal routing tracks 402 of upper and lower integrated circuit dies 910, and each of such horizontal routing tracks 402 is coupled to a separate root 401. Each of the two roots 401 is effectively coupled to two separate vertical distribution spines 501. In another configuration, clock domain 2006 may have a single clock domain root 401 at the intersection of a horizontal routing of horizontal routing tracks 402C and a vertical routing track of vertical routing tracks 403. Other details regarding clock domain 2006 are not described here to avoid repetition.

Figures 1, 21:
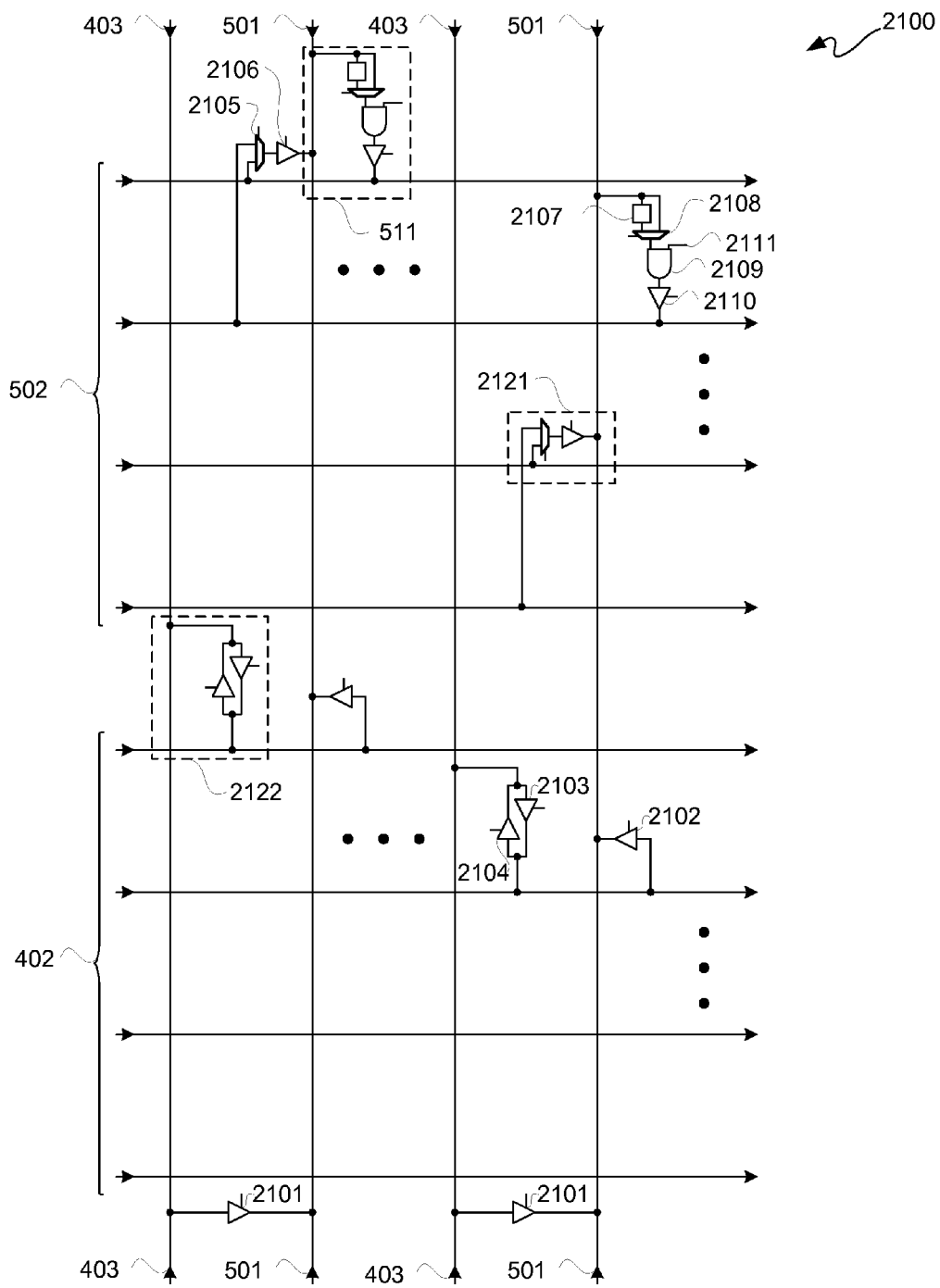
Figures 2, 21:
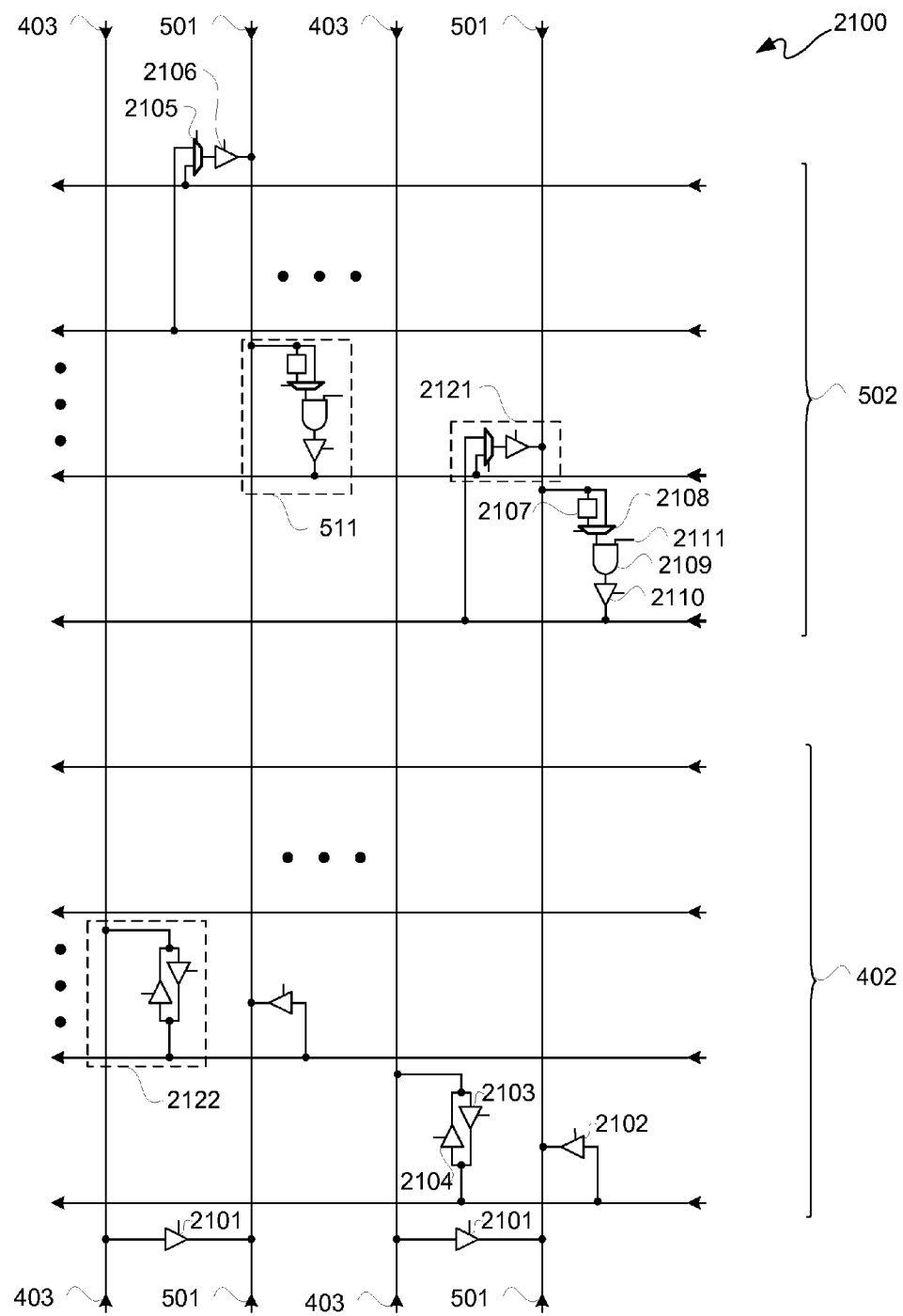

FIGS. 21-1 and 21-2 ("FIG. 21") are circuit/block diagrams depicting an exemplary clock network 2100 for an FSR 203. Clock network 2100 includes horizontal routing tracks 402, vertical routing tracks 403, horizontal distribution spines 502, and vertical distribution spines 501. FIG. 21-1 is a left portion of an FSR 203, and FIG. 21-2 is a right portion of such FSR 203.

A vertical routing track 403 may be coupled to a vertical distribution spine 501 through a tri-state buffer 2101. An input of tri-state buffer 2101 may be coupled to a vertical routing track 403, and an output of tri-state buffer 2101 may be coupled to a vertical distribution spine 501. Configuration memory cells (not shown here) may be used to program control signals for tri-state buffers 2101 to put them in either a buffer state or a high impedance tri-state. Accordingly, vertical routing tracks 403 may be selectively coupled to corresponding vertical distribution spines 501.

A vertical distribution spine 501 may be coupled to a horizontal routing track 402 through a tri-state buffer 2102. An input of tri-state buffer 2102 may be coupled to a horizontal routing track 402, and an output of tri-state buffer 2102 may be coupled to a vertical distribution spine 501. Configuration memory cells (not shown here) may be used to program control signals for tri-state buffers 2102 to put them in either a buffer state or a high impedance tri-state. Accordingly, horizontal routing tracks 402 may be selectively coupled to corresponding vertical distribution spines 501.

Vertical routing tracks 403 may be coupled to a horizontal routing tracks 402, and vice versa, through bidirectional couplers 2122. Bidirectional coupler 2122 includes a tri-state buffer 2103 and a tri-state buffer 2104 coupled in a loop. An input of tri-state buffer 2103 is coupled to an output of tri-state buffer 2104 and to a vertical routing track 403. An output of tri-state buffer 2103 is coupled to a horizontal routing track 402. An input of tri-state buffer 2104 is coupled to an output of tri-state buffer 2103 and to a horizontal routing track 402. An output of tri-state buffer 2104 is coupled to a vertical routing track 403. Configuration memory cells (not shown here) may be used to program control signals for tri-state buffers 2103 and 2104 to put each of them in either a buffer state or a high impedance tri-state. For operation of a bidirectional coupler 2122, either or both of tri-state buffers 2103 and 2104 are in a tri-state condition, namely associated routing tracks are not electrically coupled to one another, or one of such tri-state buffers 2103 and 2104 is in a tri-state condition and the other of such tri-state buffers 2103 and 2104 is in a buffer condition. If a tri-state buffer 2103 is in a buffer condition and a tri-state buffer 2104 is in a tri-state condition of a bidirectional coupler 2122, then a clock signal on a vertical routing track 403 may be passed through such tri-state buffer 2103 to a corresponding horizontal routing track 402. Likewise, if a tri-state buffer 2104 is in a buffer condition in a tri-state buffer 2103 is in a tri-state condition of a bidirectional coupler 2122, then a clock signal on a horizontal routing track 402 may be passed through such tri-state buffer 2104 to a corresponding vertical routing track 403.

Again, it should be appreciated that routing tracks 402 and 403, as well as distribution spines 501 and 502, are bidirectional. Along those lines, corresponding circuitry for driving signals in an opposite direction, which are not shown for purposes of clarity and not limitation, may be present in one or more embodiments.

Either of two horizontal distribution spines 502 may be coupled to a corresponding vertical distribution spine 501 using selectable coupler 2121. Selectable coupler 2121 includes a multiplexer 2105 and a tri-state buffer 2106. Configuration memory cells (not shown here) may be used to program control signals for tri-state buffers 2106 to put each of them in either a buffer state or a high impedance tri-state. Likewise, configuration memory cells (not shown here) may be used to program control select signals to multiplexers 2105. For a selectable coupler 2121, an input of multiplexer 2105 is coupled to a horizontal distribution spine 502, and another input of multiplexer 2105 is coupled to another horizontal distribution spine 502. A control select signal may be set for selecting a clock signal on one of such horizontal distribution spines 502 for output from such multiplexer 2105. Output from such multiplexer 2105 is provided as an input to corresponding tri-state buffer 2106. Tri-state buffer 2106 has an output coupled to corresponding vertical distribution spine 501. In a buffer condition, tri-state buffer 2106 may pass such clock signal to such corresponding vertical distribution spine 501, and in a tri-state condition, tri-state buffer 2106 electrically decouples output of multiplexer 2105 from such vertical distribution spine 501. Accordingly, pluralities of horizontal distribution spines 502 may be selectively coupled to corresponding ones of vertical distribution spines 501.

A vertical distribution spine 501 may be coupled to a corresponding horizontal distribution spine 502 through optional delay and clock gate 511. In an embodiment, an optional delay and clock gate 511 includes a delay block 2107, a multiplexer 2108, an AND gate 2109, and a tri-state buffer 2110. An input of delay block 2107 and an input of multiplexer 2108 are coupled to a vertical distribution spine 501. An output of delay block 2107 is coupled to another input of multiplexer 2108. An output of multiplexer 2108 is provided as an input to AND gate 2109. Another input to AND gate 2109 is a clock enable ("CE") signal 2111. An output of AND gate 2109 is provided to an input of tri-state buffer 2110. In output of tri-state buffer 2110 is coupled to a horizontal distribution spine 502. Configuration memory cells (not shown here) may be used to program control signals for tri-state buffers 2110 to put them in either a buffer state or a high impedance tri-state. Likewise, configuration memory cells (not shown here) may be used to program control select signals to multiplexers 2108. Multiplexer 2108 may be used to select whether output therefrom is delayed or not by delay block 2107. AND gate 2109 may be used to pass a clock signal to tri-state buffer 2110 when CE signal 2111 is logic high, and to prevent passing such clock signal to tri-state buffer 2110 when CE signal 2111 is logic low. When CE signal 2111 is logic low, output of AND gate 2109 is logic low. In a buffer state, tri-state buffer 2110 may be used to couple output of AND gate 2109 to such horizontal distribution spine 502. In a high impedance tri-state, tri-state buffer 2110 may be used to electrically decouple output of AND gate 2109 from such horizontal distribution spine 502.

Because vertical routing tracks 403 and horizontal routing tracks 402 are segmented and bidirectional at the horizontal and vertical boundary of each FSR 203, track sharing may be employed. This allows for more clock signals to be used with fewer clock resources. For example, a single horizontal routing track segment 402 may be driven in opposite directions from a source node thereof. In other words, one clock signal may be driven to the right of such a source node, and another clock signal may be driven to the left of such a source node along a same horizontal routing track segment 402. Along those lines, for two non-overlapping clock regions, a same horizontal routing track 402 may be shared.

Figure 22:
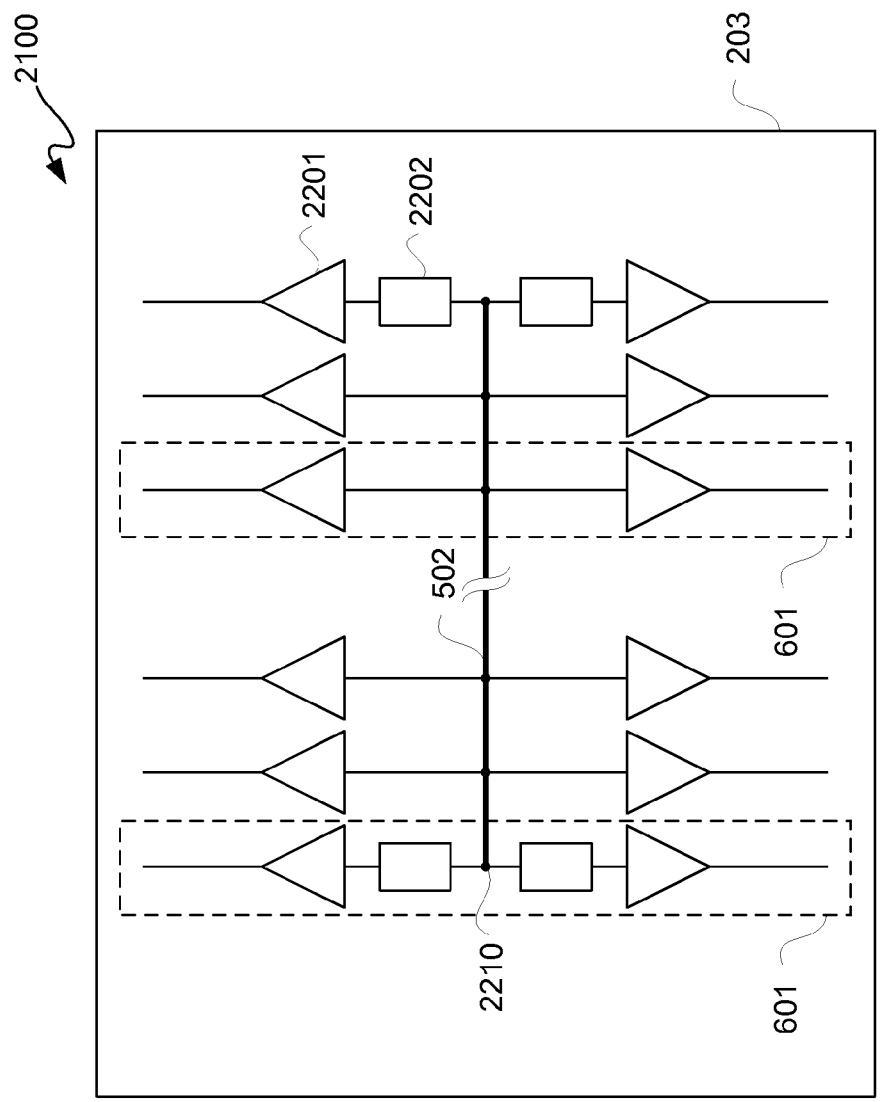
FIG. 22 is a circuit/block diagram depicting an exemplary "leaf" of a clock network.

FIG. 22 is a circuit/block diagram depicting an exemplary leaf 601 of clock network 2100. Even though six leaves 601 are illustratively depicted, it should be understood that fewer or more leaves within an FSR 203 may be used.

Leaves 601 are coupled to horizontal distribution spine 502. Each leaf 601 includes a driver buffer 2201. Driver buffers 2201 may be tri-state buffers, as described below in additional detail. One or more leaves 601 may include optional delays 2202. Configuration memory cells (not shown here) may be used for selectively adding delay through optional delays 2202. A leaf 601 may be coupled at a node 2210 to a horizontal distribution spine 502. A clock signal may be passed up to an input of an optional delay 2202 and down to an input of another optional delay 2202 of such leaf 601. Output from an upper optional delay 2202 may be provided as an input to an upper driver buffer 2201, and output of such upper driver buffer 2201 may be coupled to one or more clock loads of a circuit cloud 300. Likewise, output from a lower optional delay 2202 may be provided as input to a lower driver buffer 2201, and output of such lower driver buffer 2201 may be coupled to one or more other clock loads of a circuit cloud 300. Either, both, or neither of optional delays 2202 of a leaf 601 may be programmably set for providing a delay. Thus, for example, a clock signal may be delayed by an upper optional delay 2202 of a leaf 601, but not be delayed by a lower optional delay 2202 of a same leaf 601, and vice versa. Not all leaves 601 may have optional delays 2202. For a leaf 601 without any optional delays 2202, a clock signal at node 2210 may be directly provided to inputs of upper and lower driver buffers 2201 of such leaf 601.

Accordingly, to avoid or reduce hold time problems between horizontally adjacent FSRs 203, optional delays 2202 may be used to spread the delay between two or more clock leaves 601 for example. In other words, skew, or more particularly skew discontinuity, may be amortized, distributed, or otherwise spread across multiple columns of FSRs 203.

Figure 24:
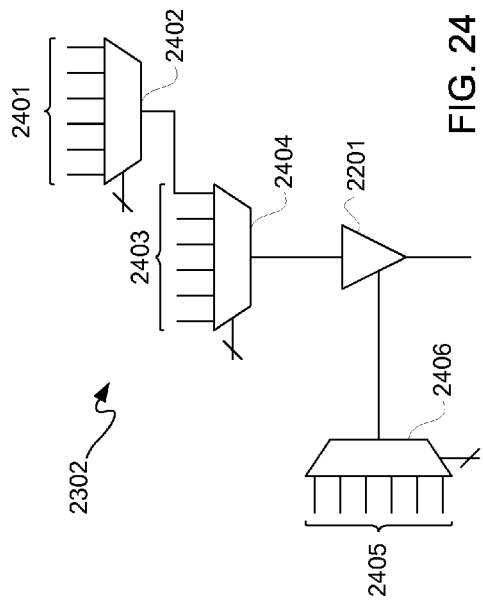
FIG. 24 is a circuit diagram depicting an exemplary portion of an interconnect tile.
Figure 23:
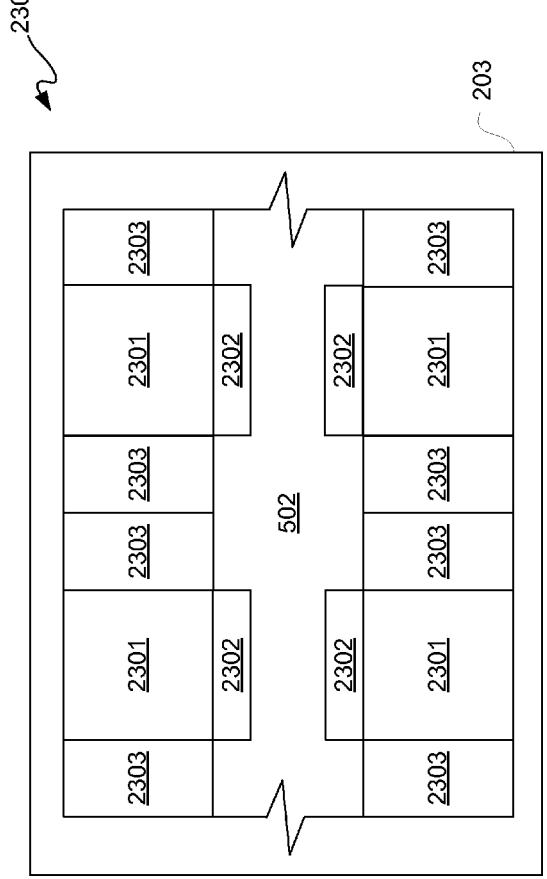
FIG. 23 is a block diagram depicting an exemplary portion of an FSR.

FIG. 23 is a block diagram depicting an exemplary portion 2300 of an FSR 203. FIG. 24 is a circuit diagram depicting an exemplary portion of an interconnect tile 2301. With simultaneous reference to FIGS. 1 through 24, portion 2300 is further described.

FSR 203 may include configurable logic elements ("CLEs") 2303, interconnect blocks or tiles 2301, and one or more horizontal distribution spines 502, among other components. A portion 2302, such as a dedicated fraction for example, of each interconnect block 2301 may be used for coupling data sources and/or clock sources, such as of CLEs 2303, to a leaf clock driver buffer 2201. One or more clock inputs 2403 may be coupled as inputs to multiplexer 2404. One or more local interconnect inputs 2401 may be coupled as inputs to multiplexer 2402. One or more local interconnect inputs 2504 may be coupled as inputs to multiplexer 2406. Control select inputs to multiplexers 2402, 2404, and 2406 may be programmatically set by configuration memory cells (not shown here) for selection of respective outputs from such multiplexers.

Output of multiplexer 2406 is provided to a tri-state input port of tri-state driver buffer 2201. Accordingly, tri-state driver buffer 2201 may be put in a tri-state condition or a buffer condition, such as previously described. Output of multiplexer 2402 is provided as an input to multiplexer 2404. Along those lines, a clock signal may be passed from a local interconnect as a clock input 2403, such as a global clock input for example. Output of multiplexer 2404 is provided as an input to tri-state driver buffer 2201. Output of tri-state driver buffer 2201 may be provided to one or more clock loads, such as in one or more CLEs 2303.

Accordingly, interconnects that pass over leaf clock drivers, such as tri-stateable driver buffers 2201, may be tapped off and sent to leaf clock enable multiplexers. Such interconnects may further support routing of high fanout data networks. In an embodiment, a dedicated fraction of an interconnect tile may be used to support extra inputs used for leaf clock inputs. In another embodiment, a user may tap off existing interconnects that flow through a horizontal distribution spine 502. Leaf clocks may be separately gated and driven locally without using a horizontal distribution spine 502. By gating a clock, clock power may be reduced.

While the foregoing describes exemplary embodiments, other and further embodiments in accordance with the one or more aspects may be devised without departing from the scope thereof, which is determined by the claims that follow and equivalents thereof. Trademarks are the property of their respective owners.

What is claimed is:

1. An apparatus, comprising:
an integrated circuit having a clock network in an array of circuit blocks;
wherein the clock network includes routing tracks, distribution spines, and clock leaves;
wherein a set of the leaves is coupled to a horizontal distribution spine of the distribution spines within a circuit block of the circuit blocks for providing a clock signal from the horizontal distribution spine to the set of the leaves;
wherein an interconnect tile is configured for local gating for providing the clock signal to the set of the leaves without going through the horizontal distribution spine; and
wherein the routing tracks and the distribution spines are bidirectional.

2. The apparatus according to claim 1, wherein the routing tracks and the distribution spines are segmented at boundaries of the circuit blocks.

3. The apparatus according to claim 1, wherein:
the routing tracks include horizontal and vertical routing tracks; and
the distribution spines include horizontal and vertical distribution spines.

4. The apparatus according to claim 1, wherein:
the routing tracks include horizontal and vertical routing tracks;
the distribution spines include horizontal distribution spines and vertical distribution spines; and
the vertical distribution spines include selectable delays respectively coupled to the horizontal distribution spines.

5. The apparatus according to claim 1, wherein intersections of the distribution spines provide a pool of clock roots.

6. The apparatus according to claim 1, wherein:
the circuit blocks are fabric sub-regions of programmable resources, and
the circuit blocks are configured to be coupled to input/output blocks and multi-gigabit transceiver blocks.

7. The apparatus according to claim 6, wherein:
intersections of the distribution spines provide a pool of clock roots; and
the intersections of the distribution spines are located in the fabric sub-regions of programmable resources.

8. The apparatus according to claim 1, further comprising:
delays associated with the distribution spines;
wherein the delays are selectively employable for providing progressive delay.

9. The apparatus according to claim 1, further comprising:
delays associated with the clock leaves;
wherein the delays are selectively employable for spreading skew discontinuity between adjacent ones of the circuit blocks.

10. The apparatus according to claim 1, wherein the distribution spines are segmentable and bidirectional for a portion of a clock tree preceding the clock leaves.

11. The apparatus according to claim 1, wherein the distribution spines are coupled for either a low skew clock network or low injection clock network.

12. The apparatus according to claim 1, wherein the clock leaves are locally gated through a dedicated fraction of an interconnect block.

13. An apparatus, comprising:
an integrated circuit die having a network of clock routing resources and a clock source;
a root of a clock domain is of a circuit design;
a routing track of the clock routing resources coupling the clock source and the root;
a first distribution spine of the clock routing resources coupled to the routing track;
a second distribution spine of the clock routing resources coupled to the first distribution spine and the clock source;
wherein the second distribution provides a feedback path for a clock signal;
wherein the network is in an array of circuit blocks of the integrated circuit die;
wherein the network includes clock leaves;
wherein a set of the leaves is coupled to the second distribution spine within a circuit block of the circuit blocks for providing a clock signal from the second distribution spine to the set of the leaves;
wherein the second distribution spin is a horizontal distribution spine; and
wherein an interconnect tile is configured for local gating for providing the clock signal to the set of the leaves without going through the horizontal distribution spine.

14. The apparatus according to claim 13, further comprising:
a delay circuit coupled between the first distribution spine and the second distribution spine;
wherein the clock source is to adjust for delay of the delay circuit responsive to the clock signal fed back.

15. The apparatus according to claim 14, wherein the clock source includes a phase lock loop.

16. The apparatus according to claim 14, wherein the root of the clock domain is located anywhere in the network where the routing track and the first distribution spine intersect.

17. An apparatus, comprising:
a first integrated circuit die having a first network of first clock routing resources;
a first routing track of the first clock routing resources coupling a clock source of the first integrated circuit die to a second routing track of the first clock routing resources;
a second integrated circuit die having a second network of second clock routing resources;
a third routing track of the second clock routing resources coupled to the second routing track;
a first root of a circuit design coupled to the clock source via the first routing track and the second routing track; and
a second root of the circuit design coupled to the clock source via the first routing track, the second routing track, and the third routing track;
wherein the first root is located on the first integrated circuit die; and
wherein the second root is located on the second integrated circuit die.

18. The apparatus according to claim 17, wherein:
the first root is located at an intersection of the second routing track and a first distribution spine of first distributions spines of the first clock routing resources; and
the second root is located at an intersection of the third routing track and a second distribution spine of second distribution spines of the second clock routing resources.

19. The apparatus according to claim 18, wherein neither the first distribution spines nor the second distributions spines are coupled for die-to-die routing between the first integrated circuit die and the second integrated circuit die.

* * * * *